(12) United States Patent
Tanomura et al.

(10) Patent No.: US 9,887,681 B2
(45) Date of Patent: Feb. 6, 2018

(54) POWER TRANSMISSION SYSTEM, TRANSMISSION APPARATUS, RECEIVING APPARATUS, AND POWER TRANSMISSION METHOD

(71) Applicant: NEC Corporation, Minato-ku, Tokyo (JP)

(72) Inventors: Masahiro Tanomura, Tokyo (JP); Shuhei Yoshida, Tokyo (JP); Kaoru Shizuno, Tokyo (JP)

(73) Assignee: NEC CORPORATION, Tokyo (JP)

( * ) Notice: Subject to any disclaimer, the term of this patent is extended or adjusted under 35 U.S.C. 154(b) by 232 days.

(21) Appl. No.: 14/768,308

(22) PCT Filed: Feb. 20, 2014

(86) PCT No.: PCT/JP2014/053996
§ 371 (c)(1),
(2) Date: Aug. 17, 2015

(87) PCT Pub. No.: WO2014/129531
PCT Pub. Date: Aug. 28, 2014

(65) Prior Publication Data
US 2015/0365066 A1    Dec. 17, 2015

(30) Foreign Application Priority Data

Feb. 20, 2013    (JP) ................. 2013-031024

(51) Int. Cl.
*H01F 38/14*    (2006.01)
*H03H 7/40*    (2006.01)
(Continued)

(52) U.S. Cl.
CPC ............. *H03H 7/40* (2013.01); *H01F 38/14* (2013.01); *H02J 50/12* (2016.02); *H02J 50/80* (2016.02);
(Continued)

(58) Field of Classification Search
None
See application file for complete search history.

(56) References Cited

U.S. PATENT DOCUMENTS

2010/0007214 A1*    1/2010    Howard ............... B60L 11/182
                                                                 307/104
2011/0127848 A1    6/2011    Ryu et al.
(Continued)

FOREIGN PATENT DOCUMENTS

JP    S62-122435 U    8/1987
JP    H09308140 A    11/1997
(Continued)

OTHER PUBLICATIONS

Japanese Office Action for JP Application No. 2015-501488 dated Oct. 25, 2016 with English Translation.
(Continued)

*Primary Examiner* — Jared Fureman
*Assistant Examiner* — Aqeel Bukhari

(57) ABSTRACT

A transmission apparatus transmits electric power via a medium that is present between the transmission apparatus and a receiving apparatus. The transmission apparatus includes: an antenna; and a power transmission circuit that outputs electric power via the antenna of the transmission apparatus, the electric power having a first resonance frequency determined by an impedance of the medium, an impedance of the antenna of the transmission apparatus, and an impedance of an antenna of the receiving apparatus.

10 Claims, 29 Drawing Sheets

(51) Int. Cl.
*H04B 5/00* (2006.01)
*H02J 50/12* (2016.01)
*H02J 50/80* (2016.01)

(52) U.S. Cl.
CPC ......... *H04B 5/0037* (2013.01); *H04B 5/0075* (2013.01)

(56) References Cited

U.S. PATENT DOCUMENTS

| | | | |
|---|---|---|---|
| 2011/0309687 A1* | 12/2011 | Bohori | E21B 33/0385 307/104 |
| 2012/0095531 A1 | 4/2012 | Derbas et al. | |
| 2012/0175969 A1* | 7/2012 | Maughan | H01F 38/14 307/104 |

FOREIGN PATENT DOCUMENTS

| | | |
|---|---|---|
| JP | 2004166384 A | 6/2004 |
| JP | 2007-210402 A | 8/2007 |
| JP | 2007324532 A | 12/2007 |
| JP | 4772744 B2 | 11/2008 |
| JP | 2009302963 A | 12/2009 |
| JP | 2010141966 A | 6/2010 |
| JP | 2011022640 A | 2/2011 |
| JP | 2011344530 A | 12/2011 |
| JP | 2012504387 A | 2/2012 |
| JP | 2012050321 A | 3/2012 |
| WO | 2010036980 A1 | 4/2010 |
| WO | 2011030804 A1 | 3/2011 |
| WO | 2014034491 A1 | 3/2014 |

OTHER PUBLICATIONS

International Search Report for PCT Application No. PCT/JP2014/053996, dated May 20, 2014.

Venkat R.Gaddam et al., "Remote power delivery for hybrid integrated bio-implantable electrical stimulation system", Optomechatronic Micro/Nano Devices and Components III : Oct. 8-10, 2007, Lausanne, Switzerland; [Proceedings of SPIE, ISSN 0277-786X], SPIE, Bellingham, Wash, vol. 5763, XP-002543548, pp. 20-31, May 16, 2005.

Ning Xue et al., "Systematic analysis and experiment of inductive coupling and induced voltage for inductively coupled wireless implantable neurostimulator application", Journal of Micromechanics and Microengineering, Institute of Physics Publishing, Bristol, GB, val. 22, No. 7, XP020225684, Jun. 7, 2012. pp. 1-10.

Extended European Search Report for EP Application No. EP14753585.0 dated Sep. 16, 2016.

* cited by examiner

FIG. 35

| MEDIUM | ELECTRIC CONDUCTIVITY (S/m) | RELATIVE PERMITTIVITY |
|---|---|---|
| SEAWATER | APPROX. 4 | APPROX. 81 |
| RIVER WATER | APPROX. $10^{-2}$ TO $10^{-1}$ | APPROX. 81 |
| FRESH WATER, TAP WATER | APPROX. $10^{-3}$ TO $10^{-2}$ | APPROX. 81 |
| SOIL (WET) | APPROX. $10^{-2}$ TO $10^{-1}$ | APPROX. 3 TO 6 |
| CONCRETE | APPROX. $10^{-3}$ TO $10^{-2}$ | APPROX. 5 TO 10 |
| SOIL (DRY) | APPROX. $10^{-4}$ TO $10^{-3}$ | APPROX. 3 TO 6 |
|  |  |  |
| *AIR | 0 | APPROX. 1 |

POWER TRANSMISSION SYSTEM, TRANSMISSION APPARATUS, RECEIVING APPARATUS, AND POWER TRANSMISSION METHOD

This application is a National Stage Entry of PCT/JP2014/053996 filed on Feb. 20, 2014, which claims priority from Japanese Patent Application 2013-031024 filed on Feb. 20, 2013, the contents of all of which are incorporated herein by reference, in their entirety.

TECHNICAL FIELD

The present invention relates to a power transmission system, a transmission apparatus, a receiving apparatus, and a power transmission method.

BACKGROUND ART

In recent years, marine resource exploration equipments and undersea earthquake sensor networks for early earthquake detection are becoming widespread, and there is an increased demand for an apparatus for supplying electric power to these equipments. The apparatus for supplying electric power needs to use a wireless power transmission technique that enables efficient power transmission even in seawater, because the surrounding area of the apparatus is seawater. The wireless power transmission technique needs to be a technique that does not require the power supply metal plugs to be exposed, and that has no possibility of shorting even in seawater, which has an electric conductivity of approximately 4 S/m.

In general, a transmission apparatus that wirelessly transmits/receives electric power has a coil formed by a conductor wire wound thereon several times. Application of alternating current power to this coil produces a magnetic flux that interlinks with the coil. As a result of this magnetic flux interlinking with the coil of the receiving apparatus, induced current is generated in the coil of the receiving apparatus, and thereby power transmission is performed.

Regarding the wireless technique, for example, Patent Document 1 discloses a technique in which a terminal device main body and a removable electronic device such as a memory card, perform electromagnetic induction type communication using wireless millimeter wave signals.

Patent Document 2 discloses a technique that uses electromagnetic induction in which an inductance value between the transmission apparatus and the receiving apparatus is increased to thereby increase the distance of electric power transmission.

Patent Document 3 discloses a technique that uses electromagnetic induction in which resonance (magnetic field resonance) is made at the same frequency, using a coil of a high Q value, to thereby improve mutual inductance between the transmission apparatus and the receiving apparatus, and increase the distance of electric power transmission.

PRIOR ART DOCUMENTS

Patent Documents

[Patent Document 1] Japanese Unexamined Patent Application, First Publication No. 2011-022640
[Patent Document 2] Japanese Patent Publication No. 4772744
[Patent Document 3] Published Japanese Translation No. 2012-504387 of the PCT International Publication

SUMMARY OF THE INVENTION

Problem to be Solved by the Invention

However, in order to perform electric power transmission efficiently in the wireless power transmission techniques of Patent Document 1 through Patent Document 3 that use electromagnetic induction technology, it is necessary to have the coil of the transmission apparatus and the coil of the receiving apparatus distanced from each other such that they are in almost intimate contact. For example, here is assumed a case where a submarine is the target of electric power transmission in seawater. In this case, when supplying electric power to the submarine, positioning between the submarine and the electric power supply apparatus needs to be performed at a high level of precision. Therefore, it is difficult to perform stable electric power supply.

Moreover, it is a known fact that only a limited level of electric power transmission efficiency can be achieved even if the techniques for increasing power transmission distance disclosed in Patent Document 2 and Patent Document 3, which are techniques for increasing in-air power transmission distance, are applied to power transmission in seawater. The reason for this is that electric conductivity and dielectric permittivity significantly differ between air and seawater, and the power transmission mechanisms in a medium differ between in-air power transmission and in-seawater power transmission. The electric conductivity of air is 0 S/m and the relative permittivity is approximately 1. On the other hand, the electric conductivity of seawater is approximately 4 S/m and the relative permittivity is approximately 81.

Here is briefly described the point of physical difference between the case where wireless electric power propagates through air and the case where it propagates through seawater.

In the case of electric power transmission through air, there is almost no power consumption associated with the medium (air) itself. The factors of reduced electric power transmission efficiency in this case mainly includes conductor loss in the coil, consistency loss between the transmission apparatus and the receiving apparatus, reflection loss such as magnetic flux leakage, and radiation loss. Particularly in the technique disclosed in Patent Document 2, a coil of a high Q value is used, and a non-radiative phenomenon, in which energy is accumulated in close proximity to the transmission/receiving apparatuses, is created, to thereby effectively suppress this radiation loss.

In the case of electric power transmission through seawater, the medium (seawater) has a certain level of electric conductivity, and therefore, electric power consumption associated with the medium becomes an energy loss. The contributing factor to this energy loss is based on the electric conductivity of the seawater and the electric field generated in the seawater. That is to say, a potential gradient in proportion to the product of this electric conductivity and electric field is generated in the seawater, and a loss occurs as a result. Moreover, since the electric conductivity of seawater is high, if non-directional energy output is made from the transmission apparatus in this seawater, it will not reach the opposing receiving apparatus, and energy loss increases. Therefore, in order to efficiently perform electric power transmission in seawater, directionality needs to be provided so as to connect the coil planes that oppose each other, and an energy flow substantially perpendicular to both of the coil planes needs to be formed.

The coil plane here refers to a plane that includes, as an outer shape, the loop that is formed by electric current flowing through the coil.

Taking into consideration the difference between the in-air energy propagation mechanism and the in-seawater energy propagation mechanism, it is particularly difficult, with use of the technique disclosed in Patent Document 1, to transmit millimeter wave signals through a good conductor medium such as seawater. For example, in the case of a 60 GHz millimeter wave, the distance at which energy decays to a quarter in propagation through seawater is 100 μm or less. Therefore, it is extremely difficult to perform propagation of 10 cm or more in seawater.

In the case of increasing the distance of electric power supply through seawater with use of the technique disclosed in Patent Document 2 that uses magnetic bodies and resonance, the magnetic flux increases. On the other hand, the electric field component that radiates into seawater also increases, in association with the increased magnetic flux. As a result, the electric power transmission efficiency will not increase. Furthermore, the technique disclosed in Patent Document 2 that uses magnetic bodies and resonance is a technique that uses the non-radiative phenomenon. Accordingly, it is fundamentally difficult to realize an increase in the distance of electric power transmission within a highly conductive medium.

Moreover, in the case of the relevant magnetic field resonance technique disclosed such as in Patent Document 3, efficient energy transmission can be performed only by having an equal resonance frequency in the transmission apparatus and the receiving apparatus. However, since the relative permittivity in seawater is 81, which is significant, the resonance frequency is influenced significantly by the impedance of the medium between the transmission apparatus and the receiving apparatus. Therefore, it is difficult to perform energy transmission by simply using the resonance phenomenon of the transmission/receiving apparatuses. Furthermore, the magnetic field resonance technique is a technique that uses the non-radiative phenomenon, and it is therefore fundamentally difficult to realize an increase in the distance of electric power transmission within a highly conductive medium.

Various types of media such as the ones shown in the table of FIG. 35 also have comparatively high electric conductivity and relative permittivity. Therefore, similar problems may occur also in the case of performing electric power transmission wirelessly in these types of media in addition to seawater.

The techniques disclosed in Patent Document 1 through Patent Document 3 are techniques for performing only either one of electric power transmission and communication. There is a demand for a technique that enables both electric power transmission and communication.

An exemplary object of the present invention is to provide a power transmission system, a transmission apparatus, a receiving apparatus, and a power transmission method that solves the above problems.

Means for Solving the Problem

A power transmission system according to a first exemplary aspect of the present invention includes a transmission apparatus and a receiving apparatus. The transmission apparatus includes a first antenna; and a first power transmission circuit that outputs electric power via the first antenna, the electric power having a first resonance frequency determined by an impedance of a medium, an impedance of the first antenna, and an impedance of a second antenna, the medium being present between the transmission apparatus and the receiving apparatus. The receiving apparatus includes: the second antenna; and a second power transmission circuit that receives, via the second antenna, the electric power outputted by the transmission apparatus.

A transmission apparatus according to a second exemplary aspect of the present invention is used for transmitting electric power via a medium that is present between the transmission apparatus and a receiving apparatus. The transmission apparatus includes: an antenna; and a power transmission circuit that outputs electric power via the antenna of the transmission apparatus, the electric power having a first resonance frequency determined by an impedance of the medium, an impedance of the antenna of the transmission apparatus, and an impedance of an antenna of the receiving apparatus.

A receiving apparatus according to a third exemplary aspect of the present invention is used for receiving electric power via a medium that is present between a transmission apparatus and the receiving apparatus. The receiving apparatus includes: an antenna; and a power transmission circuit that receives electric power from the transmission apparatus via the antenna of the receiving apparatus, the electric power having a first resonance frequency determined by an impedance of the medium, an impedance of an antenna of the transmission apparatus, and an impedance of the antenna of the receiving apparatus.

A power transmission method according to a fourth exemplary aspect of the present invention is used for a transmission apparatus and a receiving apparatus. The power transmission method includes: outputting electric power via an antenna of the transmission apparatus, the electric power having a first resonance frequency determined by an impedance of a medium, an impedance of the antenna of the transmission apparatus, and an impedance of an antenna of the receiving apparatus, the medium being present between the transmission apparatus and the receiving apparatus; and receiving the output electric power via the antenna of the receiving apparatus.

A power transmission method according to a fifth exemplary aspect of the present invention is used for a transmission apparatus that transmits electric power via a medium that is present between the transmission apparatus and a receiving apparatus. The power transmission method includes: outputting electric power via an antenna of the transmission apparatus, the electric power having a first resonance frequency determined by an impedance of the medium, an impedance of the antenna of the transmission apparatus, and an impedance of an antenna of the receiving apparatus.

A power transmission method according to a sixth exemplary aspect of the present invention is used for a receiving apparatus that receives electric power via a medium that is present between a transmission apparatus and the receiving apparatus. The power transmission method includes: receiving electric power via an antenna of the receiving apparatus, the electric power having a first resonance frequency determined by an impedance of the medium, an impedance of an antenna of the transmission apparatus, and an impedance of the antenna of the receiving apparatus.

Effect of the Invention

According to an exemplary embodiment of the present invention, it is possible to reduce electromagnetic energy that is diffused into a good conductor medium and that becomes lost when the coil of the transmission apparatus and the coil of the receiving apparatus are separated from an almost intimate contact state. As a result, it is possible to increase the distance of wireless electric power transmission within a good conductor medium such as seawater. Furthermore, it is also possible to perform communication by providing a power transmission side wireless communication circuit that outputs a communication signal at a resonance frequency.

BRIEF DESCRIPTION OF THE DRAWINGS

FIG. 35 is a diagram showing a table that summarizes electric conductivities and relative permittivities of various types of media.

EMBODIMENTS FOR CARRYING OUT THE INVENTION

Figure 1:
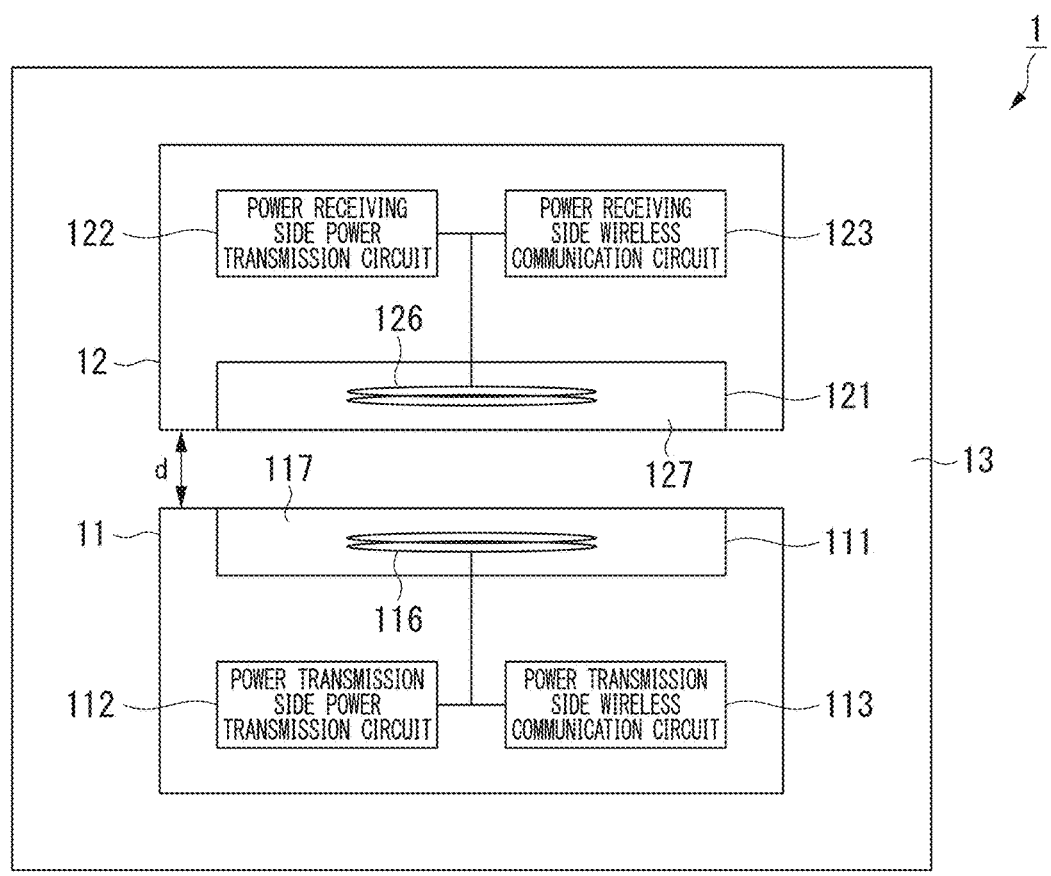
FIG. 1 is a diagram showing a power transmission system according to an exemplary embodiment of the present invention.

FIG. 1 is a diagram showing a power transmission system 1 according to an exemplary embodiment of the present invention.

As shown in FIG. 1, the power transmission system 1 of the present invention includes at least a transmission apparatus 11 and a receiving apparatus 12.

The transmission apparatus 11 includes a power transmission side antenna 111, a power transmission side power transmission circuit 112, and a power transmission side wireless communication circuit 113. The power transmission side antenna may be referred to as a first antenna in some cases. The power transmission side power transmission circuit may be referred to as a first power transmission circuit in some cases. The power transmission side wireless communication circuit may be referred to as a first wireless communication circuit in some cases.

The receiving apparatus 12 includes a power receiving side antenna 121, a power receiving side power transmission circuit 122, and a power receiving side wireless communication circuit 123. The power receiving side antenna may be referred to as a second antenna in some cases. The power receiving side power transmission circuit may be referred to as a second power transmission circuit in some cases. The power receiving side wireless communication circuit may be referred to as a second wireless communication circuit in some cases.

The first antenna 111 and the second antenna 121 are covered by a good conductor medium (medium) 13.

First Exemplary Embodiment

Figure 2:
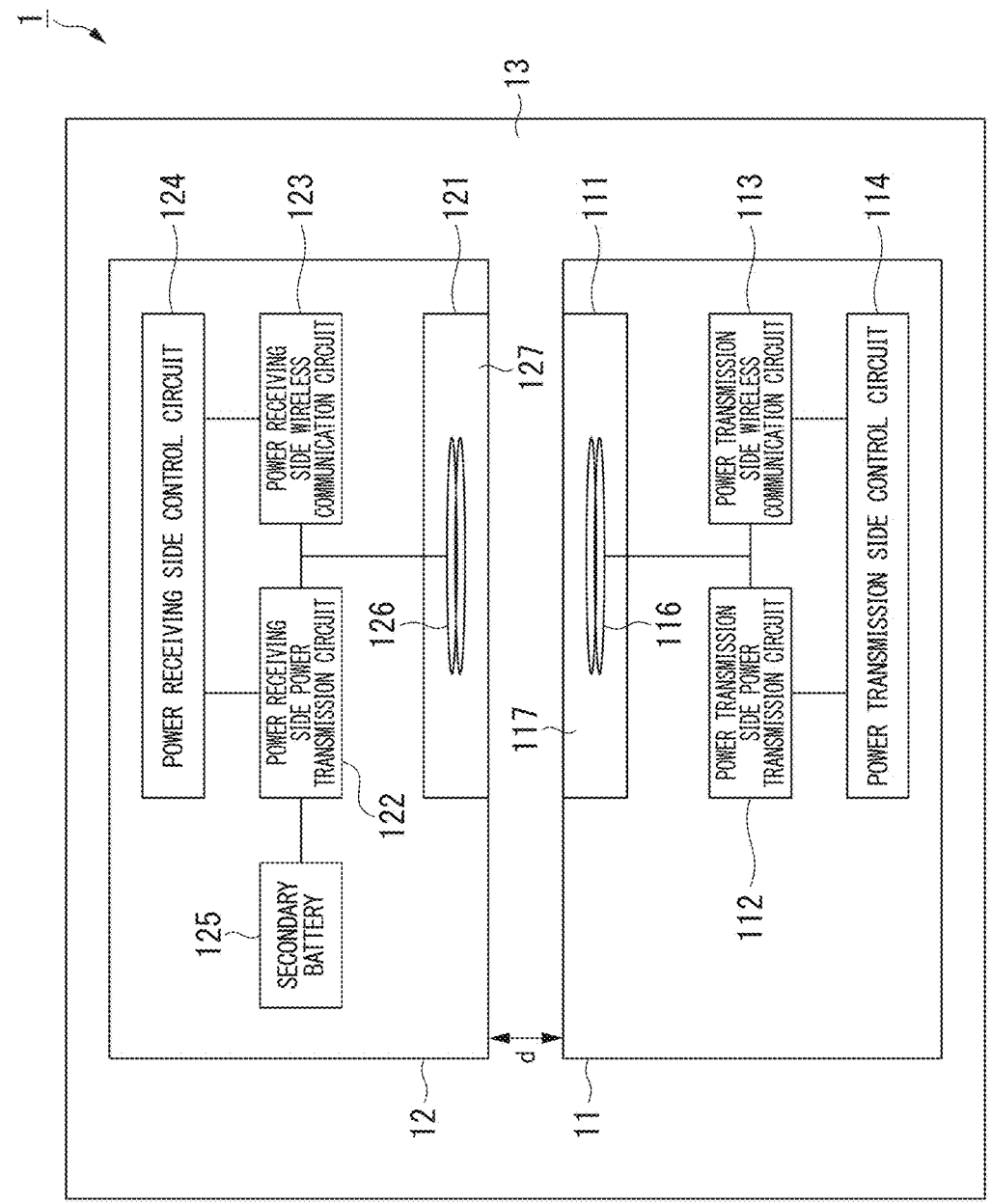
FIG. 2 is a diagram showing a configuration of a power transmission system according to a first exemplary embodiment of the present invention.

FIG. 2 is a diagram showing a configuration of the power transmission system 1 according to a first exemplary embodiment of the present invention.

Hereunder, the power transmission system 1 according to the first exemplary embodiment of the present invention is described, with reference to the drawings.

As shown in FIG. 1, the power transmission system 1 includes the transmission apparatus 11 and the receiving apparatus 12. The transmission apparatus 11 includes the first antenna 111, the first power transmission circuit 112, the first wireless communication circuit 113, and a power transmission side control circuit 114. The power transmission side control circuit may be referred to as a first control circuit in some cases.

The receiving apparatus 12 includes the second antenna 121, the second power transmission circuit 122, the second wireless communication circuit 123, and a power receiving side control circuit 124. The power receiving side control circuit may be referred to as a second control circuit in some cases.

The first antenna 111 and the second antenna 121 are covered by a good conductor medium 13. The first antenna 111 includes a power transmission side coil 116, and a power transmission side containment unit 117 formed with a dielectric body that covers the power transmission side coil 116. The power transmission side coil may be referred to as a first coil in some cases. The power transmission side containment unit may be referred to as a first containment unit in some cases. As with the first antenna 111, the power receiving side antenna 121 includes a power receiving side coil 126 and a power receiving side containment unit 127. The power receiving side coil may be referred to as a second coil in some cases. The power receiving side containment unit may be referred to as a second containment unit in some cases. The first coil 116 and the second coil 126 are electrical conductors of copper wire or the like that are wound several times. The first coil 116 and the second coil 126 may be helical coils or spiral coils. However, the first coil 116 and the second coil 126 are not limited to these.

As shown in FIG. 2, the power transmission system 1 is provided with a secondary battery 125. However, the power transmission system 1 need not be provided with a secondary battery 125.

Figure 13:
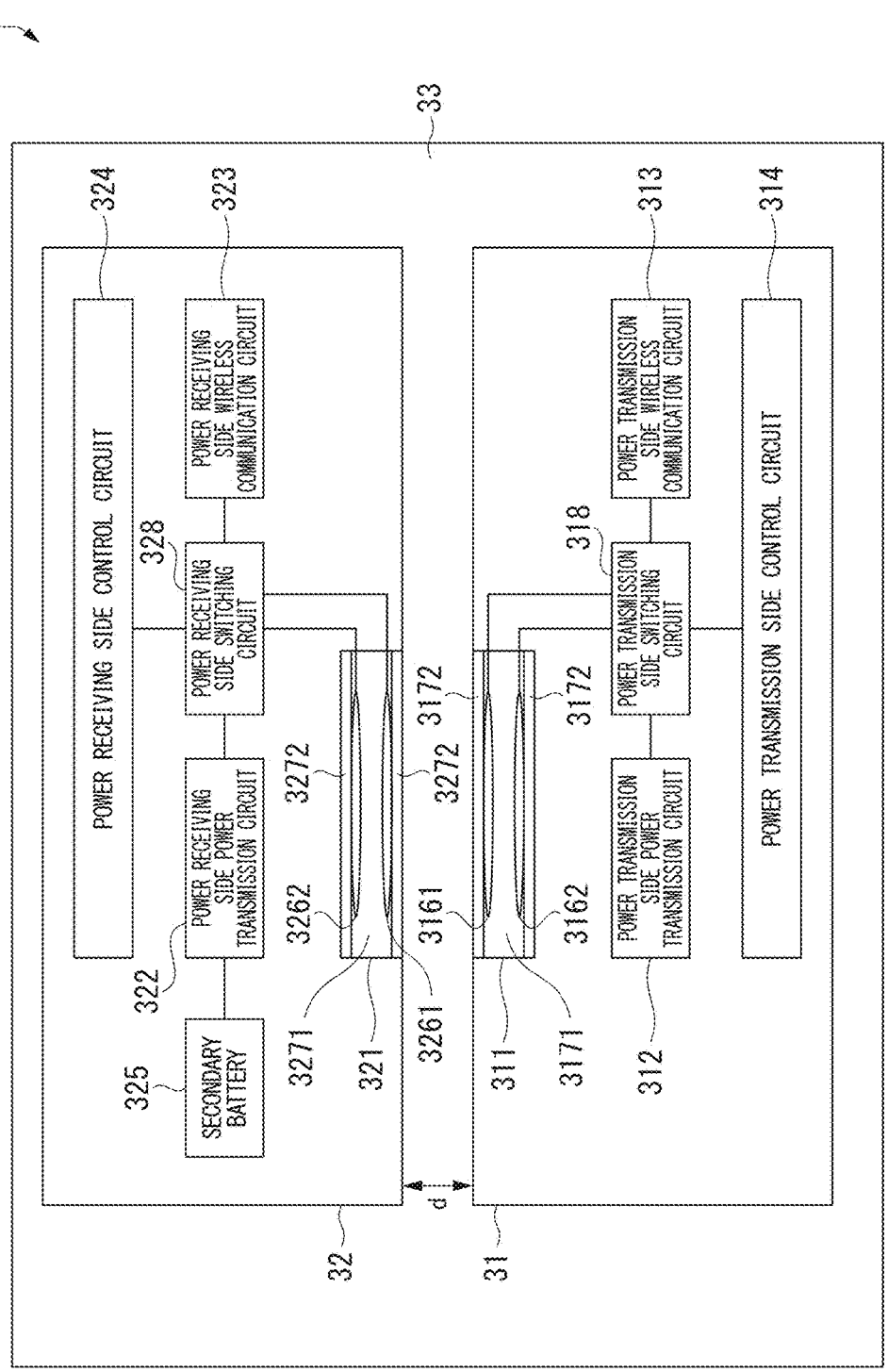
FIG. 13 is a diagram showing a configuration of a power transmission system according to a third exemplary embodiment of the present invention.

Moreover, the first coil 116 and the second coil 126 may be, for example, respectively separated into an upper coil and a lower coil as shown in FIG. 13 described later.

In the present exemplary embodiment, the first antenna 111 and the second antenna 121 in the power transmission system 1 are referred to collectively as a power transmission unit. The first coil 116 and the second coil 126 are referred to collectively as a power transmission coil. The power transmission unit transmits electric power from the transmission apparatus 11 to the receiving apparatus 12, and it also functions as an antenna for performing communication between the transmission apparatus 11 and the receiving apparatus 12.

Figure 3:
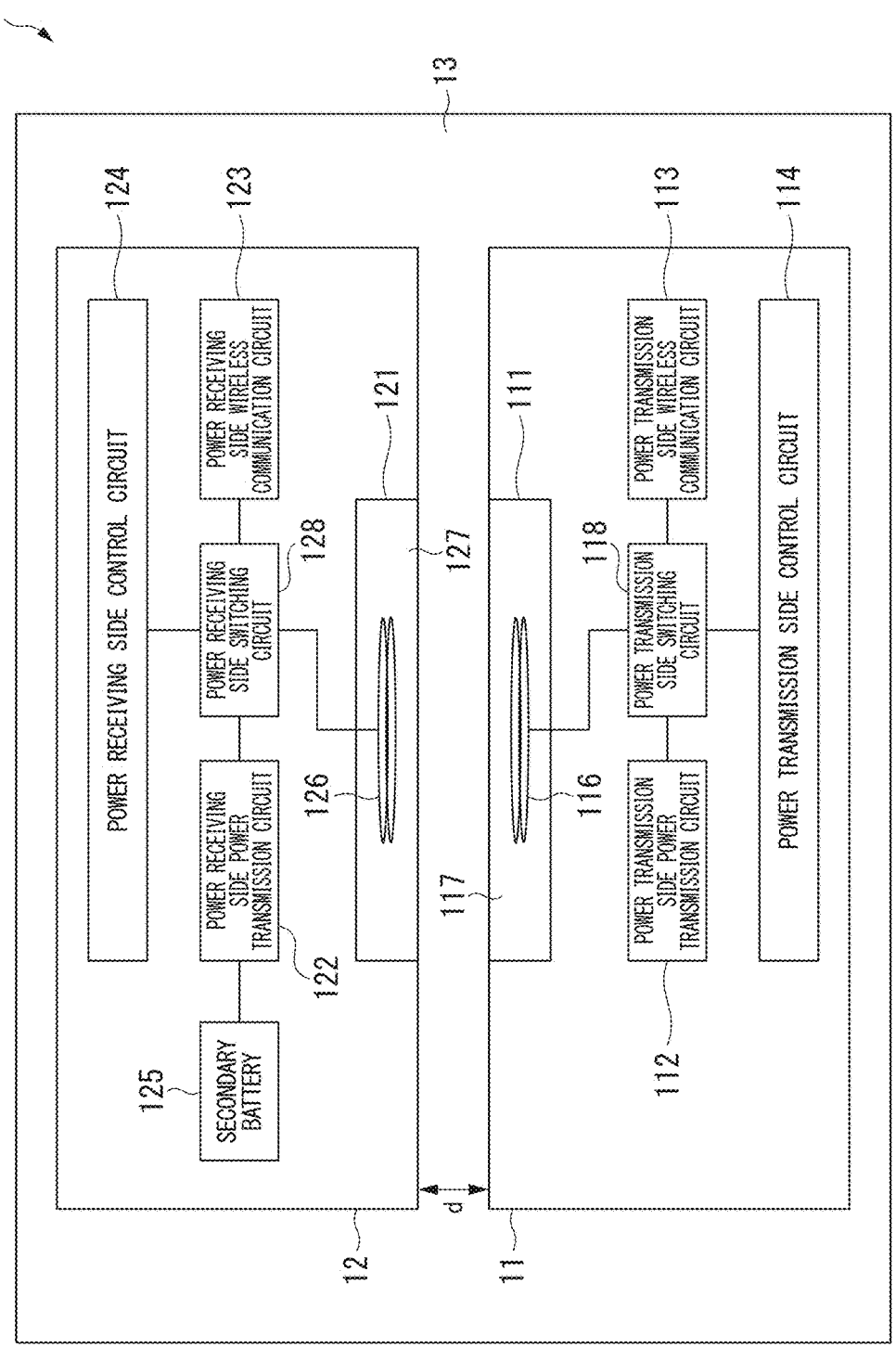
FIG. 3 is a diagram showing a configuration of a modified example of the power transmission system according to the first exemplary embodiment of the present invention.

FIG. 3 is a diagram showing a configuration of a modified example of the power transmission system 1 according to the first exemplary embodiment of the present invention.

As shown in FIG. 3, a power transmission side switching circuit 118 is connected to three functional units, namely the first antenna 111, the first power transmission circuit 112, and the first wireless communication circuit 113. The power transmission side switching circuit may be referred to as a first switching circuit in some cases.

A power receiving side switching circuit 128 is connected to three functional units, namely the second antenna 121, the second power transmission circuit 122, and the second wireless communication circuit 123. The power receiving side switching circuit may be referred to as a second switching circuit in some cases.

The first switching circuit 118 and the second switching circuit 128 may be switches or filters. However, the first switching circuit 118 and the second switching circuit 128 are not limited to these in the present exemplary embodiment. The power transmission system 1 may not include the first switching circuit 118 and the second switching circuit 128.

The first containment unit 117 and the second containment unit 127 may be formed with a dielectric body with a relative permittivity of approximately 2 to 20 and a dielectric loss tangent of 0.01 or less, such as polyethylene, polyimide, polyamide, fluorine resin, and acrylic.

Here is described a case where the good conductor medium in each exemplary embodiment is seawater. However, the good conductor medium is not limited to seawater. For example, the good conductor medium may be a substance with an electric conductivity of $1 \times 10^{-4}$ S/m or more and a relative permittivity of not less than 1, such as river water, fresh water, tap water, soil, and concrete.

Figure 4:
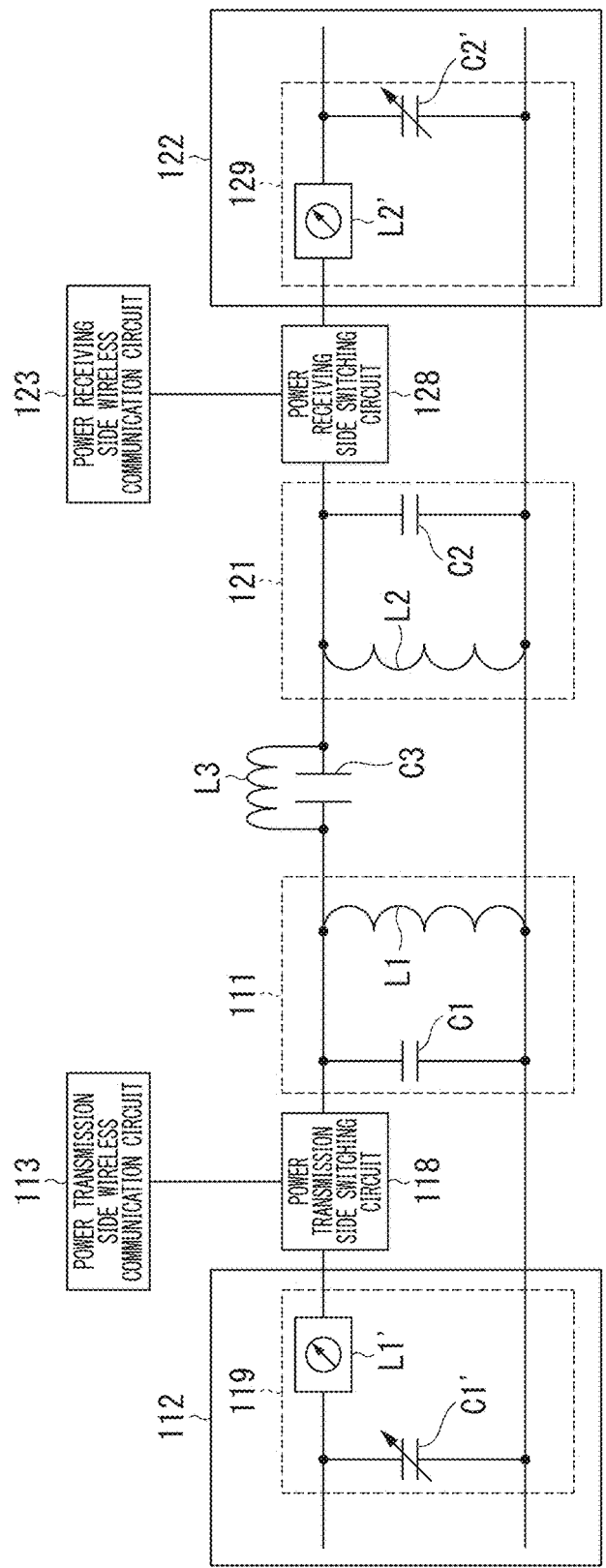
FIG. 4 is a diagram showing a part of an equivalent circuit of the power transmission system according to the first exemplary embodiment, for when wireless electric power output from a transmission apparatus propagates to a receiving apparatus.

FIG. 4 is a diagram showing a part of an equivalent circuit of the power transmission system 1, for when wireless electric power output from the transmission apparatus 11 propagates to the receiving apparatus 12.

The first power transmission circuit 112 further includes a power transmission side impedance adjustment unit 119 that adjusts the impedance of the first antenna 111. The power transmission side impedance adjustment unit may be referred to as a first impedance adjustment unit in some cases. The second power transmission circuit 122 further includes a power receiving side impedance adjustment unit 129 that adjusts the impedance of the second antenna 121. The power receiving side impedance adjustment unit may be referred to as a second impedance adjustment unit in some cases.

The impedance of the first coil 116 of the first antenna 111 primarily derives from an inductance component L1 and a capacitance component C1 that are formed in the first coil 116 and the first containment unit 117. The inductance component L1 and the capacitance component C1 are uniquely defined based on the shape of the coil, the number of windings, the thickness of the copper wire, and the dielectric permittivity of the dielectric body that forms the first containment unit 117 and its size. Similarly, the impedance of the second coil 126 of the second antenna 121 primarily derives from an inductance component L2 and a capacitance component C2 that are formed in the second coil 126 and the second containment unit 127.

In the present exemplary embodiment, the first impedance adjustment unit 119 and the second impedance adjustment unit 129 are collectively referred to simply as an impedance adjustment unit.

Alternating current power supplied from the first power transmission circuit 112 to the second power transmission circuit 122 propagates through the equivalent circuit including L10, L20, C10, C20, L3, and C3 mentioned above. Here, "L3" is a mutual inductance component in the first coil 116 and the second coil 126. "C3" is a capacitance component that is formed with the first antenna 111, the second antenna 121, and the good conductor medium 13.

In order to increase transmission efficiency at the time of propagation, it is important to perform impedance matching at the frequency of the propagating alternating current power on the propagation path. As shown in FIG. 4, the first impedance adjustment unit 119 includes a capacitance component C1' of a variable capacitance. Moreover, the second impedance adjustment unit 129 includes a capacitance component C2' of a variable capacitance. By adjusting the capacitance components C1' and C2', impedance matching can be achieved at an arbitrary frequency. Furthermore, the first impedance adjustment unit 119 further includes an impedance adjustable inductor L1'. Moreover, the second impedance adjustment unit 129 includes an impedance adjustable inductor L2'. By adjusting impedance using the inductors L1' and L2', it is possible to broaden the impedance adjustment range, compared to the case of adjusting impedance only with the variable capacitances C1' and C2'. In this manner, even if the positional relationship between the transmission apparatus 11 and the receiving apparatus 12 changes and the value of C2 changes while power transmission is being performed, C1', C2', L1', and L2 can be appropriately adjusted so as to compensate for the changes. As a result, it is possible to stably supply electric power while maintaining resonance.

As a means for changing capacitance, a varactor diode (variable capacitance diode) may be used, and it may also be configured by combining several capacitances with a switching transistor. As the inductors L1' and L2' that adjust impedance, phase shifters or variable inductors may be used.

Hereunder there is provided a description where the capacitance component that combines the capacitance component of the first antenna 111 itself and the capacitance component of an impedance adjustment circuit such as a variable capacitance and a phase shifter, is referred to as C10, and the combined capacitance component C10 serves as the capacitance component C10 that forms the impedance of the first antenna 111. Furthermore, the description is made where the inductance component that combines the inductance component of the first antenna 111 itself and the inductance component of an impedance adjustment circuit such as a variable capacitance and a phase shifter, is referred to as L10, and the combined inductance component L10 serves as the inductance component L10 that forms the impedance of the first antenna 111. Similarly, the description is made where the capacitance component that combines the capacitance component of the second antenna 121 itself and the capacitance component of an impedance adjustment circuit such as a variable capacitance and a phase shifter, is referred to as C20, and the combined capacitance component C20 serves as the capacitance component C20 that forms the impedance of the second antenna 121. Furthermore, the description is made where the inductance component that combines the inductance component of the second antenna 121 itself and the inductance component of an impedance adjustment circuit such as a variable capacitance and a phase shifter, is referred to as L20, and the combined inductance component L20 serves as the inductance component L20 that forms the impedance of the second antenna 121.

In the power transmission system 1 of the present exemplary embodiment, in the case where the capacitance component C10, the capacitance component C20, the capacitance component C3, and a distance d satisfy a predetermined condition, a particularly high level of electric power transmission efficiency can be achieved. The distance d represents the distance between the first antenna and the second antenna.

Figure 5:
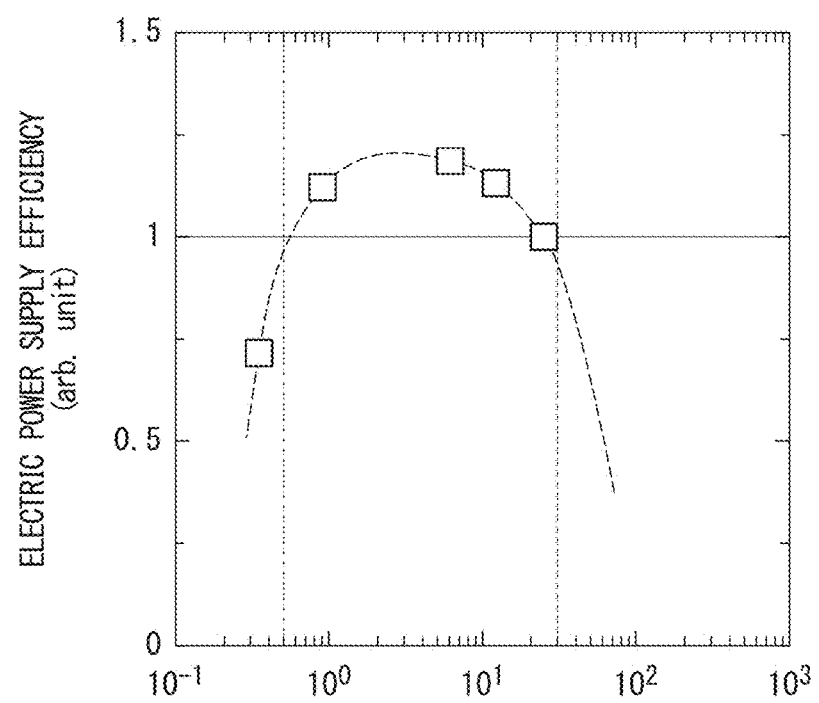
FIG. 5 is a diagram showing the influence on electric power transmission efficiency, of the capacitance components of a power transmission side antenna and a power receiving side antenna, and the capacitance component that arises between the transmission/receiving apparatuses, in the power transmission system according to the first exemplary embodiment.

FIG. 5 is a diagram showing the influence on electric power transmission efficiency, of the capacitance components of the first antenna 111 and the second antenna 121, and the capacitance component that arises between the transmission/receiving apparatuses. The vertical axis of FIG. 5 represents electric power supply efficiency (arb. unit). The horizontal axis of FIG. 5 represents the value of "capacitance component C3 that arises between transmission/receiving apparatus 11 and transmission/receiving apparatus 12"×"distance d between transmission/receiving apparatus 11 and transmission/receiving apparatus 12"/("capacitance C10 of transmission/receiving apparatus 11"+"capacitance CC20 of transmission/receiving apparatus 12").

According to FIG. 5, in the case where impedance matching is achieved, a particularly high level of electric power transmission efficiency can be achieved when the above C10[pF], C20[pF], C3[pF], and d[cm] satisfy the condition of Equation (1).

[Equation 1]

$$30 > \frac{C3 \times d}{C10 + C20} > 0.5 \qquad (1)$$

The impedance adjustment circuit need not be present as long as impedance matching is achieved. In this case, a particularly high level of electric power transmission efficiency can be achieved when the relationship of "$30 > C3 \times d/(C1+C2) > 0.5$" is satisfied.

In the present exemplary embodiment, when considering electric power of a frequency band of approximately several 100 kHz to 1 MHz, Equation (1) can be satisfied under a condition where the outer shape area of the first coil 116 and the second coil 126 is approximately 10 cm$^2$ to 30 cm$^2$, and the distance d between the first antenna 111 and the second antenna 121 is approximately 5 cm to 60 cm.

In the present exemplary embodiment, a particularly high level of electric power transmission efficiency can be achieved in the case where the ratio of the outer diameter of the first coil 116 and the dimensions of the first containment unit 117, and the ratio of the outer diameter of the second coil 126 and the dimensions of the second containment unit 127, satisfy a predetermined condition.

Figure 6A:
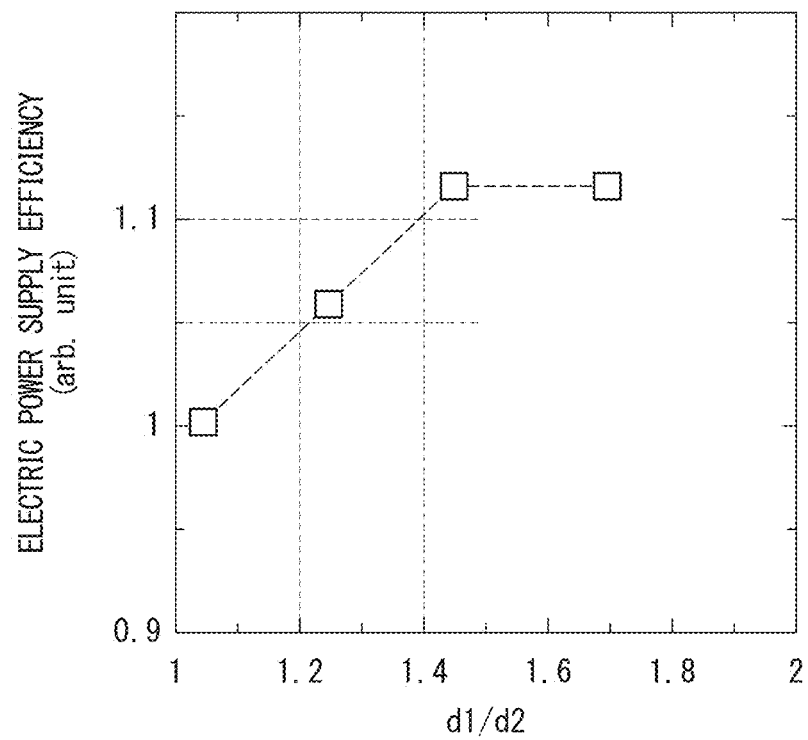
FIG. 6A is a diagram showing the influence on electric power transmission efficiency, of the ratio of the outer diameter of a power transmission side coil and the dimensions of a power transmission side containment unit, in the power transmission system according to the first exemplary embodiment.
Figure 6B:
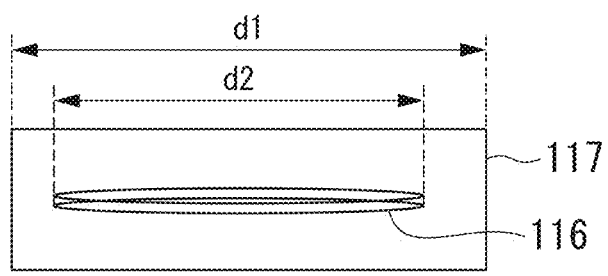
FIG. 6B is a diagram showing the influence on the electric power transmission efficiency, of the ratio of the outer diameter of the power transmission side coil and the dimensions of the power transmission side containment unit, in the power transmission system according to the first exemplary embodiment.

FIG. 6A and FIG. 6B are diagrams showing the influence on electric power transmission efficiency, of the ratio of the outer diameter of the first coil 116 and the dimensions of the first containment unit 117.

FIG. 6B shows size d1 of the first containment unit 117 in the direction along the coil plane, and outer diameter d2 of the first coil 116. According to FIG. 6A, a high level of electric power transmission efficiency, which is 5% or more higher than the minimum ratio 1 that can be achieved by manufacturing, can be achieved by fixing the size d1 and making the outer diameter d2 variable to yield the ratio (d1/d2) of 1.2 or more. Furthermore, if a level of electric power transmission efficiency that is 10% or more higher than the minimum ratio needs to be achieved, the value of the ratio (d1/d2) is preferably 1.4 or more. This is also the case where changes similar to those made to the outer diameter of the first coil 116 and the dimensions of the first containment unit 117 are made to the outer diameter of the second coil 126 and the second containment unit 127 of the second antenna 121. Moreover, a higher level of effect can be achieved if the first antenna 111 and the second antenna 121 both satisfy the above condition.

Next, specific operations of the power transmission system 1 according to the present exemplary embodiment are described in a step-by-step manner.

First, the operation at the time of performing electric power transmission is described. When performing electric power transmission, the first switching circuit 118 connects the first antenna 111 and the first power transmission circuit 112. The first control circuit 114 performs control of this switching. The second switching circuit 128 connects the second antenna 121 and the second power transmission circuit 122. The second control circuit 124 performs control of this switching. Then, an alternating power supply (not shown in the figure) of the first power transmission circuit 112 outputs alternating current power at a predetermined frequency. Next, the alternating current power that has been output is supplied to the first coil 116 via the first impedance adjustment unit 119 in the first power transmission circuit 112 and the first switching circuit 118. The first antenna 111 outputs the alternating current power to the outside (good conductor medium 13) as electromagnetic energy. The second antenna 121 of the receiving apparatus 12 receives the output electromagnetic energy. Here, the first impedance adjustment unit 119 and the second impedance adjustment unit 129 are adjusted so that the combined impedance of the respective impedances of the first antenna 111, the second antenna 121, and the good conductor medium 13 resonate at the frequency of the electric power being transmitted. The electric power that has been received by the second antenna 121, that is, the second coil 126, flows sequentially into the second switching circuit 128, the second impedance adjustment unit 129 in the second power transmission circuit 122, and a converter (not shown in the figure) in the second power transmission circuit 122. The energy that has been converted from alternating current to direct current by this converter is supplied to the secondary battery 125. This completes the process of electric power transmission.

In the power transmission system 1 of the present exemplary embodiment, by having electric power output made at a resonance frequency that is determined by the combined impedance of the respective impedances of the first antenna 111, the first impedance adjustment unit 119, the second antenna 121, the second impedance adjustment unit 129, and the good conductor medium 13, the level of electric power input to the second antenna 121 can be made a maximum. Moreover, the first containment unit 117 and the second containment unit 127 suppress the electric field from spreading into the good conductor medium 13. As a result, there is achieved an effect of suppressing electromagnetic energy that diffuses and becomes lost in the good conductor medium 13.

Figure 7:
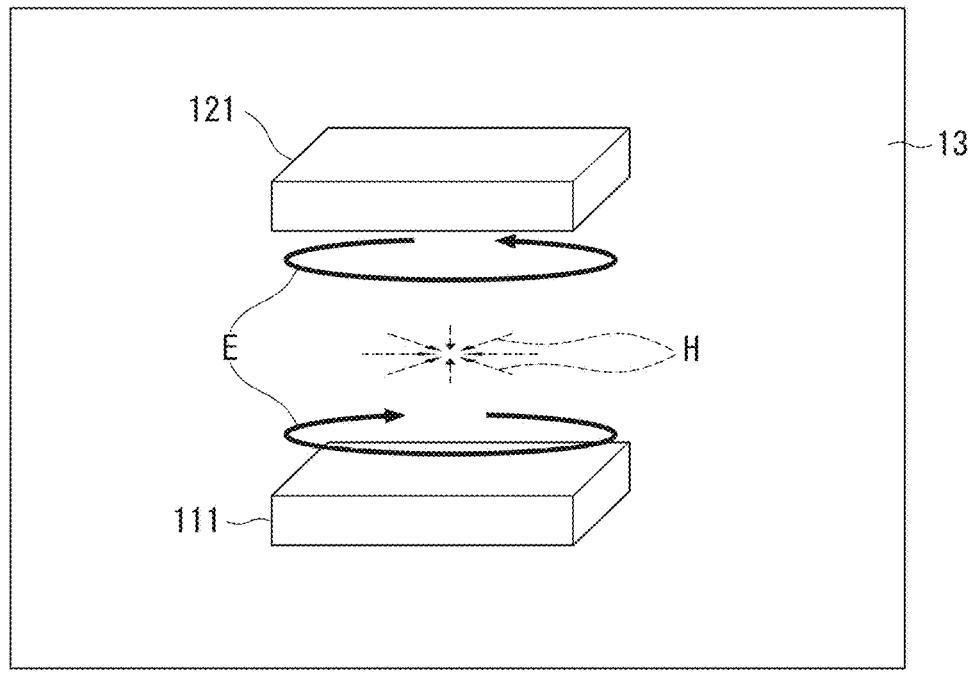
FIG. 7 is a diagram showing an electric field vector and a magnetic field vector, in the power transmission system according to the first exemplary embodiment.

FIG. 7 is a diagram showing an electric field vector and a magnetic field vector, in the power transmission system 1 according to the first exemplary embodiment. In FIG. 7, reference symbol "E" denotes electric fields and reference symbol "H" denotes magnetic field.

Figure 8:
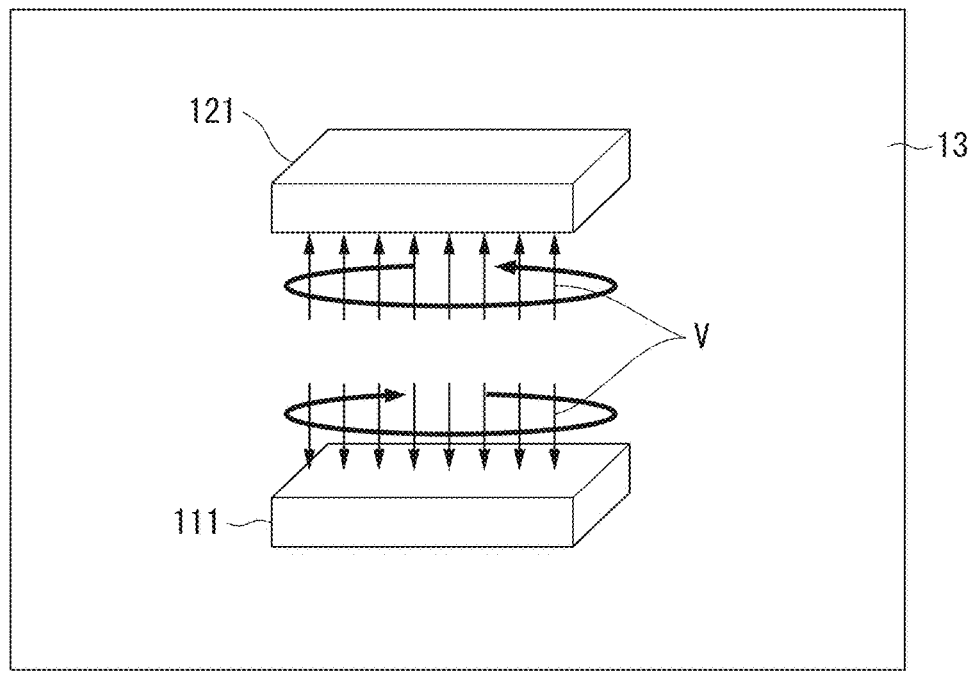
FIG. 8 is a diagram showing a pointing vector (energy flow) that occurs based on the electric field vector and the magnetic field vector, in the power transmission system according to the first exemplary embodiment.

FIG. 8 is a diagram showing a pointing vector V (energy flow) that occurs based on the electric field vector and the magnetic field vector, in the power transmission system 1 according to the first exemplary embodiment.

FIG. 7 is a diagram that schematically shows a simulation result of the electric field and magnetic field that occur between the first antenna 111 and the second antenna 121 at the time of performing electric power transmission. As shown in FIG. 7, in the power transmission system 1 of the present exemplary embodiment, the first containment unit 117 and the second containment unit 127 suppress the electric field from spreading into the good conductor medium 13. The magnetic field generated by the current flowing in the predetermined good conductor medium 13 and the coil causes an eddy current to occur in the good conductor medium 13. This eddy current creates a new magnetic field. This phenomenon occurs repeatedly, and thereby, the electric field and the magnetic field can be made substantially parallel with the coil plane. As a result, as shown in FIG. 8, it is possible to cause the pointing vector V (electromagnetic energy flow) from the first antenna 111 to the second antenna 121 to occur vertically with respect to the coil plane.

Next, the operation at the time of performing communication is described. Here is described a case where communication is made from the transmission apparatus 11 to the receiving apparatus 12. The operation of performing communication from the receiving apparatus 12 to the transmission apparatus 11 is also the same. When performing communication, the first switching circuit 118 and the second switching circuit 128 connect the power transmission unit and the wireless communication network. The first control circuit 114 and the second control circuit 124 perform control of this switching. Then, the first wireless communication circuit 113 outputs communication signals at a predetermined frequency. These output communication signals are output as electromagnetic energy to the outside (good conductor medium 13) from the first antenna 111 via the first switching circuit 118 and the first coil 116. The second antenna 121 of the receiving apparatus 12 receives the output electromagnetic energy. The communication signals received by the second antenna 121, that is, the second coil 126, are input to the second wireless communication circuit 123 via the second switching circuit 128. This completes the process of communication signal transmission.

As with the frequency at the time of electric power transmission, the frequency used in the communication is the resonance frequency that is determined by the combined impedance of the respective impedances of the first antenna 111, the second antenna 121, and the good conductor medium 13.

Figure 9:
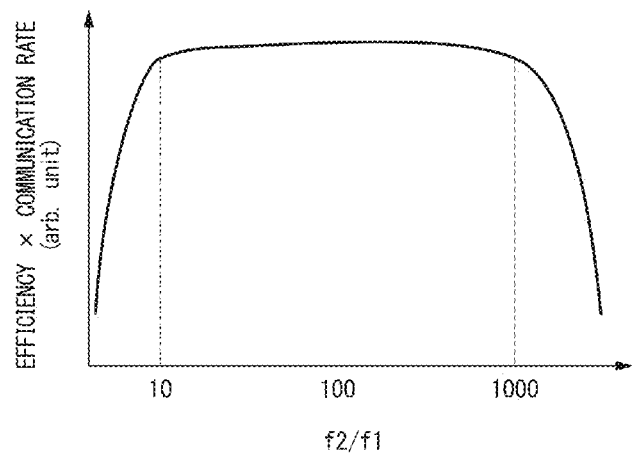
FIG. 9 is a diagram showing a relationship between ratio (communication frequency/electric power transmission frequency) and (efficiency×communication rate), in the power transmission system according to the first exemplary embodiment.

FIG. 9 is a diagram showing a relationship between ratio (communication frequency/electric power transmission frequency) and (efficiency×communication rate).

As shown in FIG. 9, by making the frequency (f2) used for communication higher than the frequency (f1) used for electric power transmission, it is possible to obtain a high level of electric power supply efficiency and a high level of communication rate. In particular, by having the relationship of "1,000>ratio (f2/f1)>10", it is possible to obtain a high level of electric power supply efficiency and a high level of communication rate. The reason for this is that while the electric power supply efficiency is increased by lowering the frequency (f1) used for electric power transmission, when the frequency (f2) used for communication is lowered, the reception signal level is increased and the S/N ratio is improved, but the fractional bandwidth is reduced.

In this manner, the power transmission system 1 according to the present exemplary embodiment is capable of suppressing diffusion and loss of electromagnetic energy in the good conductor medium to a minimum level, even in the near field where the transmission apparatus 11 and the receiving apparatus 12 are comparatively distanced from each other. As a result, it is possible to increase the distance of wireless electric power transmission and to perform communication within the good conductor medium such as seawater.

Second Exemplary Embodiment

Figure 10:
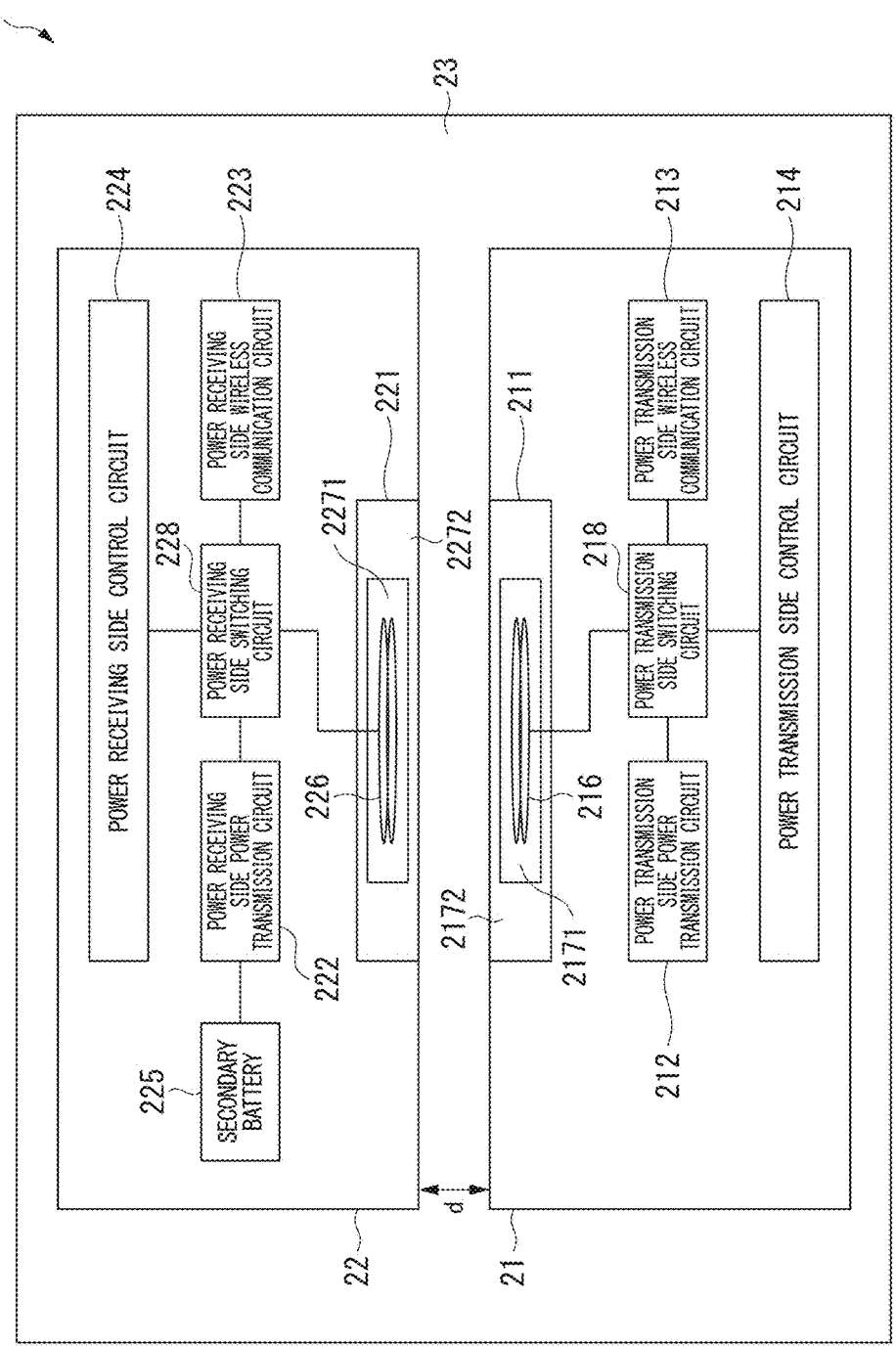
FIG. 10 is a diagram showing a configuration of a power transmission system according to a second exemplary embodiment of the present invention.

FIG. 10 is a diagram showing a configuration of a power transmission system 2 according to a second exemplary embodiment of the present invention.

The power transmission system 2 according to the second exemplary embodiment of the present invention is described, with reference to the drawings.

In FIG. 10, the power transmission system 2 includes a transmission apparatus 21 and a receiving apparatus 22. The transmission apparatus 21 includes a first antenna 211, a first power transmission circuit 212, a first wireless communication circuit 213, a first control circuit 214, and a first switching circuit 218. The receiving apparatus 22 includes a second antenna 221, a second power transmission circuit 222, a second wireless communication circuit 223, a second control circuit 224, and a second switching circuit 228. The receiving apparatus 22 may further include a secondary battery 225.

The first antenna 211 includes a power transmission side primary containment unit 2171 formed with a first coil 216 and a dielectric body that covers the first coil 216, and a power transmission side secondary containment unit 2172 formed with a second dielectric body that covers the power transmission side primary containment unit 2171. The power transmission side primary containment unit may be referred to as a first primary containment unit in some cases. The power transmission side secondary containment unit may be referred to as a first secondary containment unit in some cases. The second antenna 221 has a configuration similar to that of the first antenna 211. That is to say, the second antenna 221 includes a second coil 226, a power receiving side primary containment unit 2271, and a power receiving side secondary containment unit 2272. The power receiving side primary containment unit may be referred to as a second primary containment unit in some cases. The power receiving side secondary containment unit may be referred to as a second secondary containment unit in some cases. The first antenna 211 and the second antenna 221 are covered by a good conductor medium 23.

In the present exemplary embodiment, the first primary containment unit and the second primary containment unit are referred to collectively as a primary containment unit. Moreover, the first secondary containment unit and the second secondary containment unit are referred to collectively as a secondary containment unit.

The first primary containment unit 2171, the first secondary containment unit 2172, the second primary containment unit 2271, and the second secondary containment unit 2272 may be formed with a dielectric body with a relative permittivity of approximately 2 to 10 and a dielectric loss tangent of 0.01 or less, such as polyethylene, polyimide, polyamide, fluorine resin, and acrylic.

The relative permittivity of the first dielectric body that forms the first primary containment unit 2171 may differ from or be the same as the relative permittivity of the second dielectric body that forms the first secondary containment unit 2172. The dielectric loss tangent of the first dielectric body that forms the first primary containment unit 2171 may differ from or be the same as the dielectric loss tangent of the second dielectric body that forms the first secondary containment unit 2172. The same also applies to the first dielectric body that forms the second primary containment unit 2271 and the second dielectric body that forms the second secondary containment unit 2272.

As shown in FIG. 10, the first antenna 211 and the second antenna 221 both have the primary containment unit and the secondary containment unit. However, the configuration is not limited to this. In the present exemplary embodiment, only either one of the first antenna 211 and the second antenna 221 may have the primary containment unit and the secondary containment unit.

The power transmission system 2 of the present exemplary embodiment may include the impedance adjustment unit described in the first exemplary embodiment.

In the power transmission system 2 of the present exemplary embodiment, in the case where the dielectric loss tangents of the respective dielectric bodies that form the first primary containment unit 2171 and the first secondary containment unit 2172 satisfy a predetermined condition, a higher level of electric power transmission efficiency can be achieved.

Figure 11:
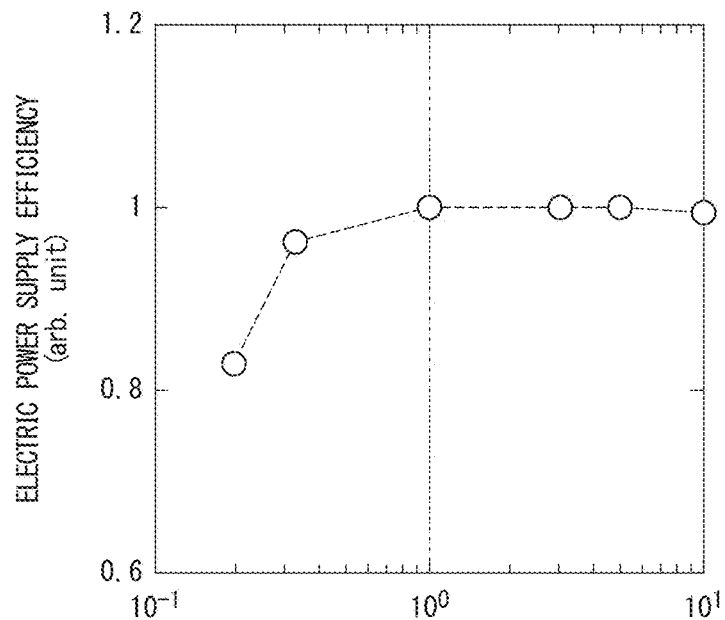
FIG. 11 is a diagram showing the influence on electric power transmission efficiency, of the ratio of the dielectric loss tangent of a first dielectric body and the dielectric loss tangent of a second dielectric body, in the power transmission system according to the second exemplary embodiment.

FIG. 11 is a diagram showing the influence on electric power transmission efficiency, of the ratio of the dielectric loss tangent of the first dielectric body and the dielectric loss tangent of the second dielectric body. The vertical axis of FIG. 11 represents electric power supply efficiency (arb. unit). The horizontal axis of FIG. 11 represents the ratio of the dielectric loss tangent of the first secondary containment unit 2172 to the dielectric loss tangent of the first primary containment unit 2171. FIG. 11 shows a case where the relative permittivity of the first primary containment unit 2171 is 10, and the relative permittivity of the first secondary containment unit 2172 is 2.1.

According to FIG. 11, it can be understood that a higher level of electric power transmission efficiency can be achieved by making the dielectric loss tangent of the second dielectric body greater than the dielectric loss tangent of the first dielectric body. This is based on achieving the effect of suppressing electric field spread to the good conductor medium 23, by the second dielectric body that forms the first secondary containment unit 2172 (second secondary containment unit 2272), and on the effect that it is possible to reduce dielectric loss in close proximity to the power transmission side coil 216 (power receiving side coil 226) by making the dielectric loss tangent of the first dielectric body that forms the first primary containment unit 2171 (second primary containment unit 2271) smaller.

In the power transmission system 2 of the present exemplary embodiment, in the case where the dielectric permittivity of the respective dielectric bodies that form the first primary containment unit 2171 and the first secondary containment unit 2172 satisfy a predetermined condition, a higher level of electric power transmission efficiency can be achieved.

Figure 12:
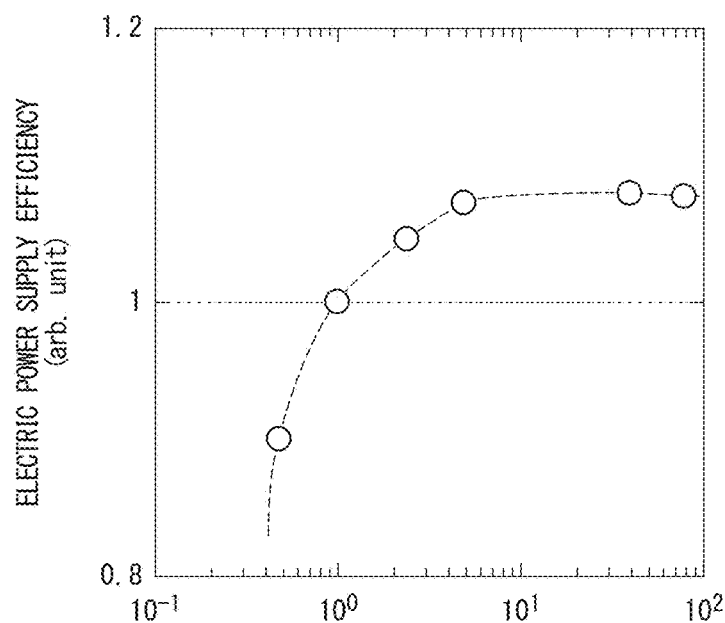
FIG. 12 is a diagram showing the influence on electric power transmission efficiency, of the relative permittivity of the first dielectric body and the relative permittivity of the second dielectric body, in the power transmission system according to the second exemplary embodiment.

FIG. 12 is a diagram showing the influence on electric power transmission efficiency, of the relative permittivity of the first dielectric body and the relative permittivity of the second dielectric body.

The vertical axis of FIG. 12 represents electric power supply efficiency (arb. unit). The horizontal axis of FIG. 12 represents the ratio of the relative permittivity of the first secondary containment unit 2172 to the relative permittivity of the first primary containment unit 2171. FIG. 11 shows a case where the dielectric loss tangent of the first dielectric body and the dielectric loss tangent of the second dielectric body are constant.

According to FIG. 12, it can be understood that a higher level of electric power transmission efficiency can be achieved by making the relative permittivity of the second dielectric body greater than the relative permittivity of the first dielectric body.

Next, specific operations of the power transmission system 2 according to the present exemplary embodiment are described in a step-by-step manner.

First, the operation at the time of performing electric power transmission is described. When performing electric power transmission, the first switching circuit 218 and the second switching circuit 228 connect the power transmission unit and the power transmission circuit. The first control circuit 214 and the second control circuit 224 perform control of this switching. Then, an alternating power supply (not shown in the figure) of the first power transmission circuit 212 outputs alternating current power at a predetermined frequency. The alternating current power that has been output, is supplied to the first coil 216 via the first impedance adjustment unit 219 in the first power transmission circuit 212 and the first switching circuit 218. The first antenna 211 outputs the alternating current power to the outside (good conductor medium 23) as electromagnetic energy. The second antenna 221 of the receiving apparatus 22 receives the output electromagnetic energy. Here, the first impedance adjustment unit 219 and the second impedance adjustment unit 229 are adjusted so that the combined impedance of the respective impedances of the first antenna 211, the second antenna 221, and the good conductor medium 23 resonate at the frequency of the electric power being transmitted. The electric power that has been received by the second antenna 221, that is, the second coil 226, flows sequentially into the second switching circuit 228, the second impedance adjustment unit 229 in the second power transmission circuit 222, and a converter (not shown in the figure) in the second power transmission circuit 222. The energy that has been converted from alternating current to direct current by this converter is supplied to the secondary battery 225. This completes the process of electric power transmission.

In the power transmission system 2 of the present exemplary embodiment, by having electric power output made at a resonance frequency that is determined by the combined impedance of the respective impedances of the first antenna 211, the first impedance adjustment unit 219, the second antenna 221, the second impedance adjustment unit 229, and the good conductor medium 23, the level of electric power input to the second antenna 221 can be made a maximum.

The first secondary containment unit 2172 and the second secondary containment unit 2272 suppress the electric field from spreading into the good conductor medium 23. As a result, it is possible to suppress to a minimum, electromagnetic energy that diffuses and becomes lost in the good conductor medium 23.

The first primary containment unit 2171 and the second primary containment unit 2271 can reduce dielectric loss in close proximity to the first coil 216 and the second coil 226.

Next, the operation at the time of performing communication is described. Here is described a case where communication is made from the transmission apparatus 21 to the receiving apparatus 22. The operation of performing communication from the receiving apparatus 22 to the transmission apparatus 21 is also the same. When performing communication, the first switching circuit 218 and the second switching circuit 228 connect the power transmission unit and the wireless communication circuit. The first control circuit 214 and the second control circuit 224 perform control of this switching. Then, the first wireless communication circuit 213 outputs communication signals at a predetermined frequency. These output communication signals are output as electromagnetic energy to the outside (good conductor medium 23) from the first antenna 211 via the first switching circuit 218 and the first coil 216. The second antenna 221 of the receiving apparatus 22 receives the output electromagnetic energy. The communication signals received by the second antenna 221, that is, the second coil 226, are input to the second wireless communication circuit 223 via the second switching circuit 228. This completes the process of communication signal transmission.

Here, as with the frequency at the time of electric power transmission, the frequency used in the communication is the resonance frequency that is determined by the combined impedance of the respective impedances of the first antenna 211, the second antenna 221, and the good conductor medium 23.

In this manner, the power transmission system 2 according to the present exemplary embodiment can achieve a level of electric power transmission efficiency higher than that of the power transmission system 1 according to the first exemplary embodiment.

Third Exemplary Embodiment

FIG. 13 is a diagram showing a configuration of a power transmission system 3 according to a third exemplary embodiment of the present invention.

The power transmission system 3 according to the third exemplary embodiment of the present invention is described, with reference to the drawings.

In FIG. 13, the power transmission system 3 includes a transmission apparatus 31 and a receiving apparatus 32. The transmission apparatus 31 includes a first antenna 311, a first power transmission circuit 312, a first wireless communication circuit 313, a first control circuit 314, and a first switching circuit 318. The receiving apparatus 32 includes a second antenna 321, a second power transmission circuit 322, a second wireless communication circuit 323, a second control circuit 324, and a second switching circuit 328. The receiving apparatus 32 may further include a secondary battery 325.

The first antenna 311 includes a power transmission side lower coil 3161, a power transmission side upper coil 3162, a first primary containment unit 3171, and a first secondary containment unit 3172. The power transmission side lower coil may be referred to as a first lower coil in some cases. The power transmission side upper coil may be referred to as a first upper coil in some cases. The first primary containment unit 3171 includes a first dielectric body that covers the first lower coil 3161 and the first upper coil 3162. The first secondary containment unit 3172 includes a second dielectric body that covers the first primary containment unit 3171. The second antenna 321 includes a power receiving side lower coil 3261, a power receiving side upper coil 3262, a second primary containment unit 3271, and a second secondary containment unit 3272. The power receiving side lower coil may be referred to as a second lower coil in some cases. The power receiving side upper coil may be referred to as a second upper coil in some cases. The second primary containment unit 3271 includes a first dielectric body that covers the second lower coil 3261 and the second upper coil 3262. The second secondary containment unit 3272 includes a second dielectric body that covers the second primary containment unit 3271. The first antenna 311 and the second antenna 321 are covered by a good conductor medium 33.

In the present exemplary embodiment, the first secondary containment unit and the second secondary containment unit are referred to collectively as a coated unit.

The first primary containment unit 3171, the first secondary containment unit 3172, the second primary containment unit 3271, and the second secondary containment unit 3272 may be formed with a dielectric body with a relative permittivity of approximately 2 to 10 and a dielectric loss tangent of 0.01 or less, such as polyethylene, polyimide, polyamide, fluorine resin, and acrylic.

One or both of the first lower coil 3161 and the first upper coil 3162 may be contained in both of the first primary containment unit 3171 and the first secondary containment unit 3172. Similarly, one or both of the second lower coil 3261 and the second upper coil 3262 may be contained in both of the second primary containment unit 3271 and the second secondary containment unit 3272.

Alternating current signals that are different in terms of negativity and positivity are applied to the first lower coil 3161 and the first upper coil 3162. Similarly, alternating current signals that are different in terms of negativity and positivity are applied to the second lower coil 3261 and the second upper coil 3262.

Figure 14:
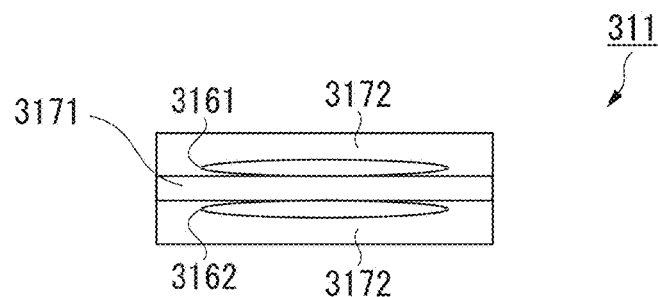
FIG. 14 is a diagram showing a configuration of a modified example of a power transmission side antenna according to the third exemplary embodiment of the present invention.

FIG. 14 is a diagram showing a configuration of a modified example of the first antenna according to the third exemplary embodiment of the present invention.

As shown in FIG. 14, in the first antenna 311, one or both of the first lower coil 3161 and the first upper coil 3162 may be contained only in the first secondary containment unit 3172. Similarly, in the second antenna 321, one or both of the second lower coil 3261 and the second upper coil 3262 may be contained only in the second secondary containment unit 3272.

The relative permittivity of the first dielectric body that forms the first primary containment unit 3171 may differ from or be the same as the relative permittivity of the second dielectric body that forms the first secondary containment unit 3172. The dielectric loss tangent of the first dielectric body that forms the first primary containment unit 3171 may differ from or be the same as the dielectric loss tangent of the second dielectric body that forms the first secondary containment unit 3172. The same also applies to the first dielectric body that forms the second primary containment unit 3271 and the second dielectric body that forms the second secondary containment unit 3272.

As shown in FIG. 13, the first antenna 311 and the second antenna 321 both have the primary containment unit and the secondary containment unit described above. However, the configuration is not limited to this. In the present exemplary embodiment, only either one of the first antenna 311 and the second antenna 321 may have the first containment unit and the second containment unit.

The power transmission system 3 of the present exemplary embodiment may include the impedance adjustment unit described in the first exemplary embodiment.

As shown in FIG. 13, by separating the first coil or the second coil, the capacitance components (C1, C2) of the coils are made higher, enhancing the effect of suppressing the electric field from being spread in the good conductor medium by the second dielectric body.

Next, specific operations of the power transmission system 3 according to the present exemplary embodiment are described in a step-by-step manner.

First, the operation at the time of performing electric power transmission is described. When performing electric power transmission, the first switching circuit 318 and the second switching circuit 328 connect the power transmission unit and the power transmission circuit. The second control circuit 324 performs control of this switching. Then, an alternating power supply (not shown in the figure) of the first power transmission circuit 312 outputs alternating current power at a predetermined frequency. The alternating current power that has been output is supplied to the first coil 316 via the first impedance adjustment unit 319 in the first power transmission circuit 312 and the first switching circuit 318. The first antenna 311 outputs the alternating current power to the outside (good conductor medium 33) as electromagnetic energy. The second antenna 321 of the receiving apparatus 32 receives the output electromagnetic energy. Here, the first impedance adjustment unit 319 and the second impedance adjustment unit 329 are adjusted so that the combined impedance of the respective impedances of the first antenna 311, the second antenna 321, and the good conductor medium 33 resonates at the frequency of the electric power being transmitted. The electric power that has been received by the second antenna 321, that is, the second coil 326, flows sequentially into the second switching circuit 328, the second impedance adjustment unit 329 in the second power transmission circuit 322, and a converter (not shown in the figure) in the second power transmission circuit 322. The energy that has been converted from alternating current to direct current by this converter is supplied to the secondary battery 325, and the process of electric power transmission is completed.

In the power transmission system 3 of the present exemplary embodiment, by having electric power output made at a resonance frequency that is determined by the combined impedance of the respective impedances of the first antenna 311, the second antenna 321, and the good conductor medium 33, the level of electric power input to the second lower coil 3261 and the second upper coil 3262 can be made a maximum.

The first secondary containment unit 3172 and the second secondary containment unit 3272 suppress the electric field from spreading into the good conductor medium 33. As a result, it is possible to suppress electromagnetic energy that diffuses and becomes lost in the good conductor medium 33.

The first primary containment unit 3171 and the second primary containment unit 3271 have an effect of increasing the capacitance component between the first lower coil 3161 and the first upper coil 3162 and the capacitance component between the first lower coil 3161 and the first upper coil 3162, which are capacitance components of the coils, while reducing dielectric loss in close proximity to the coils.

Next, the operation at the time of performing communication is described. Here is described a case where communication is made from the transmission apparatus 31 to the receiving apparatus 32. The operation of performing communication from the receiving apparatus 32 to the transmission apparatus 31 is also the same. When performing communication, the first switching circuit 318 and the second switching circuit 328 connect the power transmission unit and the wireless communication circuit. The first control circuit 314 and the second control circuit 324 perform control of this switching. Then, the first wireless communication circuit 313 outputs communication signals at a predetermined frequency. These output communication signals are output as electromagnetic energy to the outside (good conductor medium 33) from the first antenna 311 via the first switching circuit 318. The second antenna 321 of the receiving apparatus 32 receives the output electromagnetic energy. The communication signals received by the second antenna 321 are input to the second wireless communication circuit 323 via the second switching circuit 328. This completes the process of communication signal transmission.

Here, as with the frequency at the time of electric power transmission, the frequency used in the communication is the resonance frequency that is determined by the combined impedance of the respective impedances of the first antenna 311, the second antenna 321, and the good conductor medium 33.

In this manner, the power transmission system 3 according to the present exemplary embodiment can achieve a level of electric power transmission efficiency higher than that of the power transmission system 1 of the first exemplary embodiment and the power transmission system 2 of the second exemplary embodiment.

Fourth Exemplary Embodiment

Figure 15:
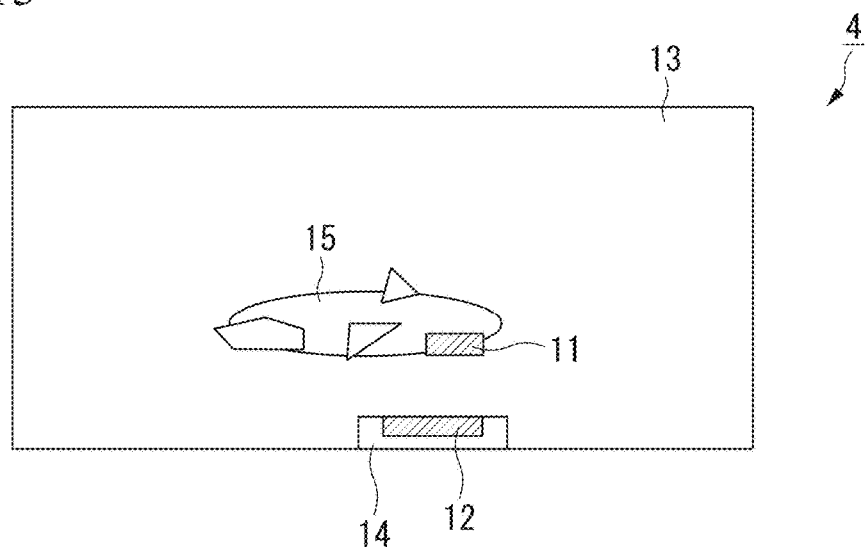
FIG. 15 is a diagram showing a configuration of a power transmission system according to a fourth exemplary embodiment of the present invention.

FIG. 15 is a diagram showing a configuration of a power transmission system 4 according to a fourth exemplary embodiment of the present invention.

As shown in FIG. 15, in the power transmission system 4 according to the fourth exemplary embodiment, a submarine 15 includes a transmission apparatus 11, and a sensor 14 includes a receiving apparatus 12. With use of the technique of the present exemplary embodiment, even in the case where a tidal current occurs and the positional relationship between the sensor 14 and the submarine 15 changes from the state of being in almost-intimate contact, the first containment unit 117 and the second containment unit 127 suppress the electric field from spreading into the good conductor medium 13. Moreover, the magnetic field generated by the current flowing in the predetermined good conductor medium 13 and the coil causes an eddy current to occur in the good conductor medium 13. Furthermore, this eddy current creates a new magnetic field. This phenomenon occurs repeatedly, and thereby, the electric field and the magnetic field can be made substantially parallel with the coil plane. As a result, it becomes possible to perform stable electric power supply with a good level of electric power transmission efficiency, and communication.

Fifth Exemplary Embodiment

Figure 16:
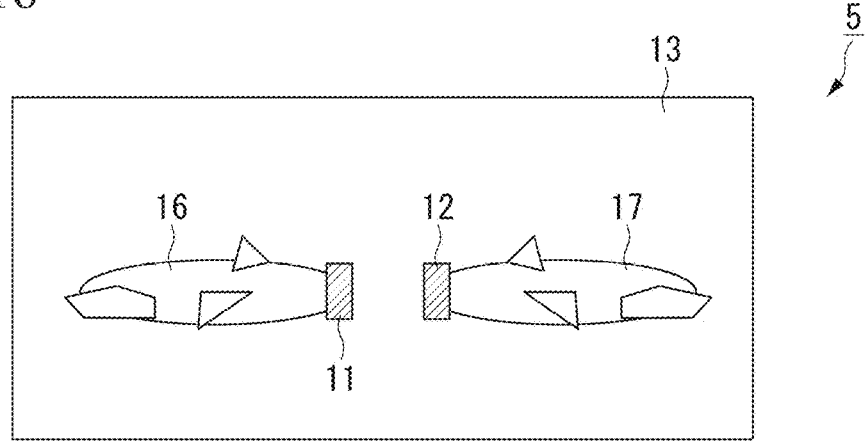
FIG. 16 is a diagram showing a configuration of a power transmission system according to a fifth exemplary embodiment of the present invention.

FIG. 16 is a diagram showing a configuration of a power transmission system 5 according to a fifth exemplary embodiment of the present invention.

As shown in FIG. 16, in the power transmission system 5 according to the fifth exemplary embodiment, a submarine 16 includes a transmission apparatus 11, and a submarine 17 includes a receiving apparatus 12. With use of the technique of the present exemplary embodiment, even in the case where a tidal current occurs and the positional relationship between the submarine 16 and the submarine 17 changes from the state of being in almost-intimate contact, the first containment unit 117 and the second containment unit 127 suppress the electric field from spreading into the good conductor medium 13. Moreover, the magnetic field generated by the current flowing in the predetermined good conductor medium 13 and the coil causes an eddy current to occur in the good conductor medium 13. Furthermore, this eddy current creates a new magnetic field. This phenomenon occurs repeatedly, and thereby, the electric field and the magnetic field can be made substantially parallel with the coil plane. As a result, it becomes possible to perform stable electric power supply with a good level of electric power transmission efficiency, and communication.

The submarine 16 and the submarine 17 use the transmission apparatus 11 as a receiving apparatus and use the receiving apparatus 12 as a transmission apparatus, and thereby, electric power supply can be performed bi-directionally. As another method, each of the submarine 16 and the submarine 17 may include both a transmission apparatus 11 and a receiving apparatus 12.

The submarine 16 including the transmission apparatus 11 may be a ship or an electric power supply source that is installed on the sea floor.

Sixth Exemplary Embodiment

Figure 17:
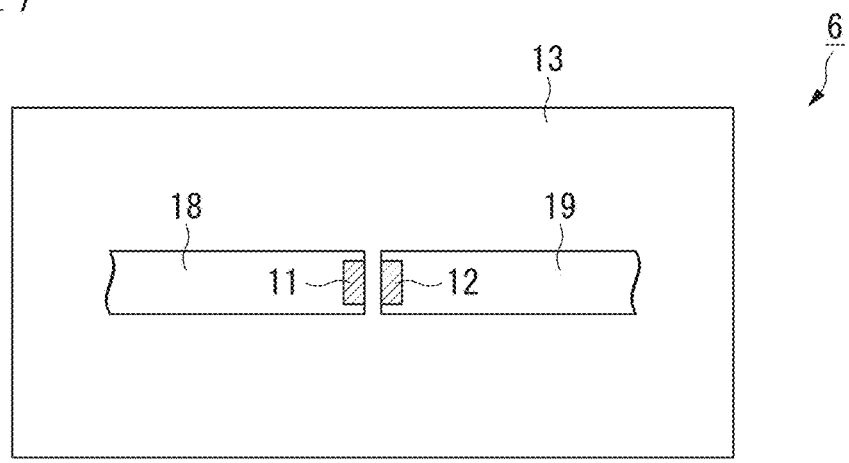
FIG. 17 is a diagram showing a configuration of a power transmission system according to a sixth exemplary embodiment of the present invention.

FIG. 17 is a diagram showing a configuration of a power transmission system 6 according to a sixth exemplary embodiment of the present invention.

As shown in FIG. 17, in the power transmission system 6 according to the sixth exemplary embodiment, a transmission apparatus 11 is included in a connection unit of a power cable 18, and a receiving apparatus 12 is included in a connection unit of a power cable 19. With use of the technique of the present exemplary embodiment, even in seawater (good conductor medium 13), it is possible to perform wireless electric power supply. As a result, the power cables can be connected contactlessly, power cable replacement becomes easy, and there is no wear, thereby improving the level of reliability.

The power cable 18 and the power cable 19 use the transmission apparatus 11 as a receiving apparatus and use the receiving apparatus 12 as a transmission apparatus, and thereby, electric power supply can be performed bi-directionally. Each of the power cable 18 and the power cable 19 may include a transmission apparatus 11 and a receiving apparatus 12. The transmission apparatus 11 and the receiving apparatus 12 have a function to wirelessly perform information communication. Therefore, there is no need for separately providing a wireless communication mechanism, and a small and low cost system can be provided by using a mechanism that is common to electric power transmission.

First Example

Figure 18:
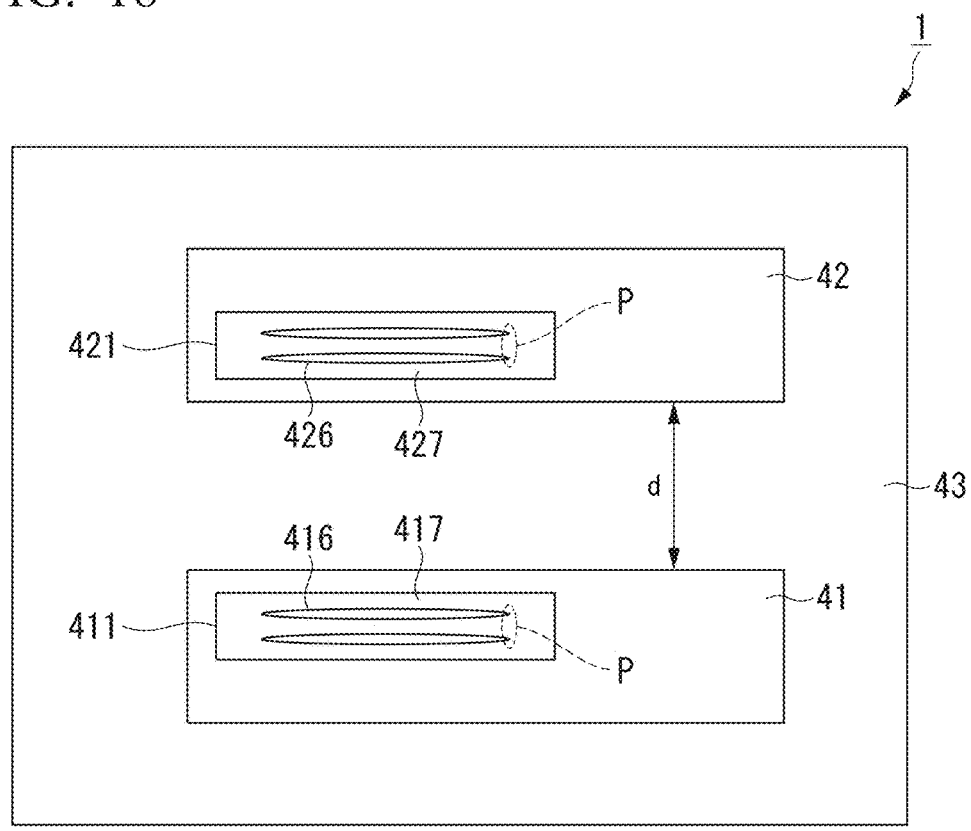
FIG. 18 is a diagram showing a simulation model for verifying the effect of the power transmission system according to the first exemplary embodiment of the present invention.

FIG. 18 is a diagram showing a simulation model for verifying the effect of the power transmission system 1 according to the first exemplary embodiment of the present invention.

Here is described a simulation that has verified the effect of the power transmission system 1 according to the first exemplary embodiment, that uses the simulation model shown in FIG. 18.

As shown in FIG. 18, the power transmission system 1 of the first exemplary embodiment includes a transmission apparatus 41 and a receiving apparatus 42. The transmission apparatus 41 and the receiving apparatus 42 are covered by seawater 43 that serves as a good conductor medium. The transmission apparatus 41 includes a first antenna 411. The first antenna 411 includes a first coil 416 and a first containment unit 417. The receiving apparatus 42 includes a second antenna 421. The second antenna 421 includes a second coil 426 and a second containment unit 427. The first coil 416 and the second coil 426 are composed of a spiral coil.

Figure 19:
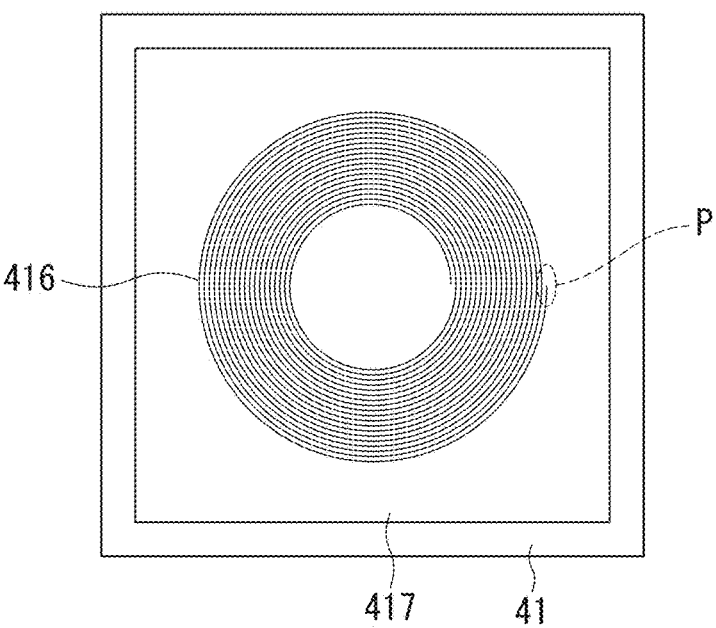
FIG. 19 is a schematic top view of a transmission apparatus in a first example of the present invention.

FIG. 19 is a schematic top view of a transmission apparatus 41 in the first example of the present invention.

As shown in FIG. 19, the first coil 416 is of a structure such that two single layer spiral coils each having 2 mm diameter wire wound 29 times with an outer diameter of 220 mm and an inner diameter of 100 mm, are arranged apart so as to oppose each other with a 3 mm distance therebetween. A power supply port P is an electric power application terminal for making the coil generate an electric field. To these opposing helical coils there is applied alternating current power from the power supply port P. The internal dielectric body (first containment unit) 417 is configured with a fluorine resin. The coated dielectric body (transmission apparatus) 41 is configured with an acrylic. The dimensions of the coated dielectric body 41 are 255 mm long, 255 mm wide, and 19 mm high. The resonance frequency of the power transmission system 1 is approximately 1 MHz. In the present example, a sufficiently high level of electric power transmission efficiency is achieved even when the ratio of the outer diameter size d2 of the spiral coil and the size d1 of the coated dielectric body (d1/d2) is 1.16, which is greater than 1. If the ratio (d1/d2) is made greater than 1.16, then a higher electric power transmission efficiency can be achieved.

The configuration of the receiving apparatus 42 is the same as that of the transmission apparatus 41. However, the configuration shown here is merely an example, and a similar effect can be achieved even when the transmission apparatus 41 and the receiving apparatus 42 are not of the same configuration.

Figure 20:
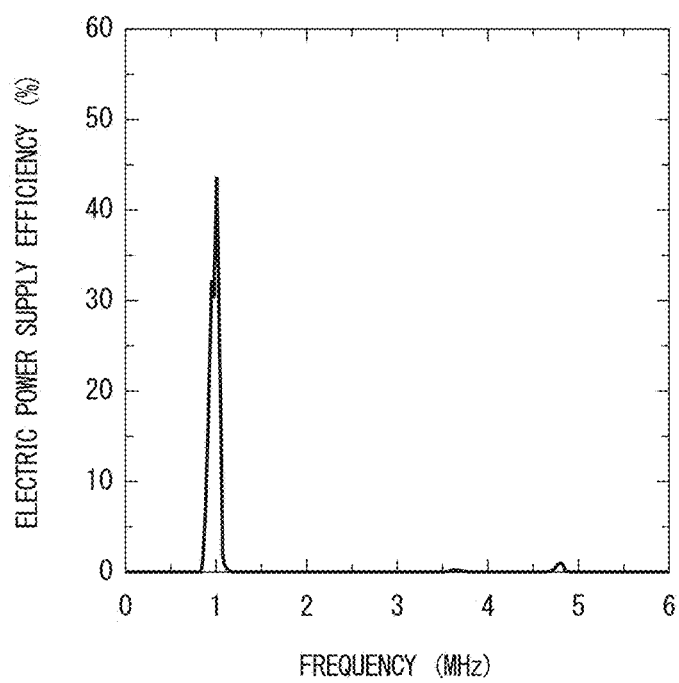
FIG. 20 is a diagram showing electric power transmission efficiency simulation results in the first example of the present invention.

FIG. 20 is a diagram showing electric power transmission efficiency simulation results in the first example of the present invention.

An electric power transmission efficiency simulation was carried out in seawater where the distance d between the transmission apparatus 41 and the receiving apparatus 42 was 10 cm. As a result, as shown in FIG. 20, the electric power transmission efficiency showed a high value, which was 40% or more, where the electric power transmission frequency (f) was in the proximity of 1 MHz.

Figure 21A:
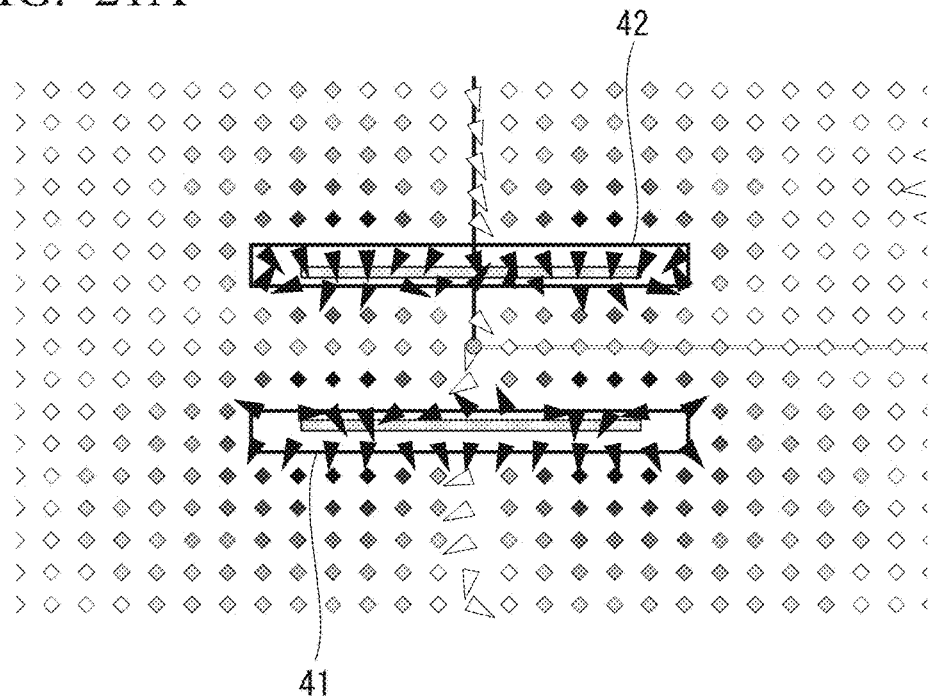
FIG. 21A is a diagram showing the electric field in close proximity to a transmission apparatus and a receiving apparatus, in a three dimensional electromagnetic field simulation of the first example of the present invention.
Figure 21B:
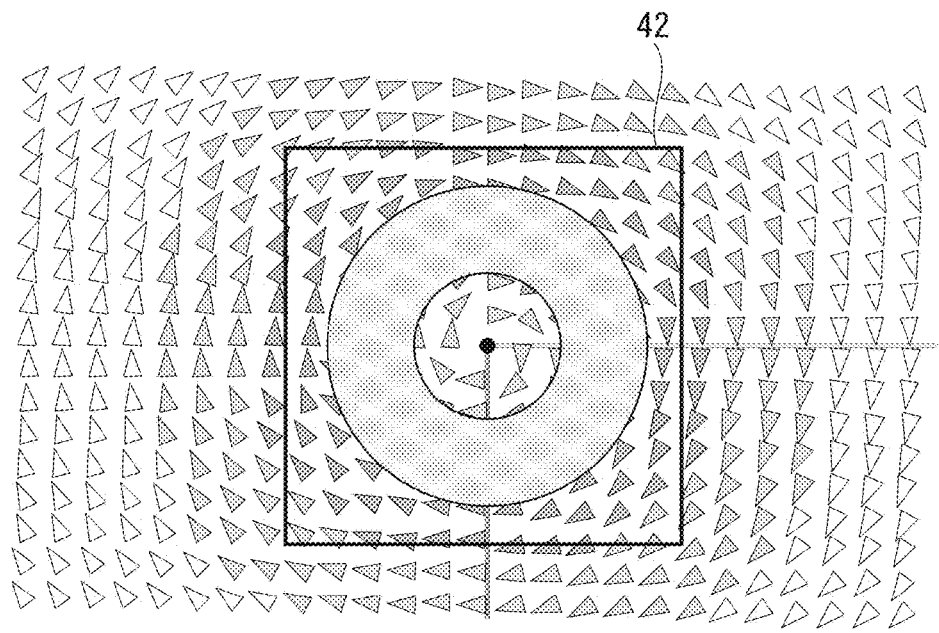
FIG. 21B is a diagram showing the electric field in close proximity to the transmission apparatus and the receiving apparatus, in a three dimensional electromagnetic field simulation of the first example of the present invention.

FIG. 21A and FIG. 21B are diagrams showing the electric field in close proximity to the transmission apparatus 41 and the receiving apparatus 42, in the three dimensional electromagnetic field simulation of the first example of the present invention. FIG. 21A shows a side sectional view. FIG. 21B shows a plane sectional view.

Figure 22A:
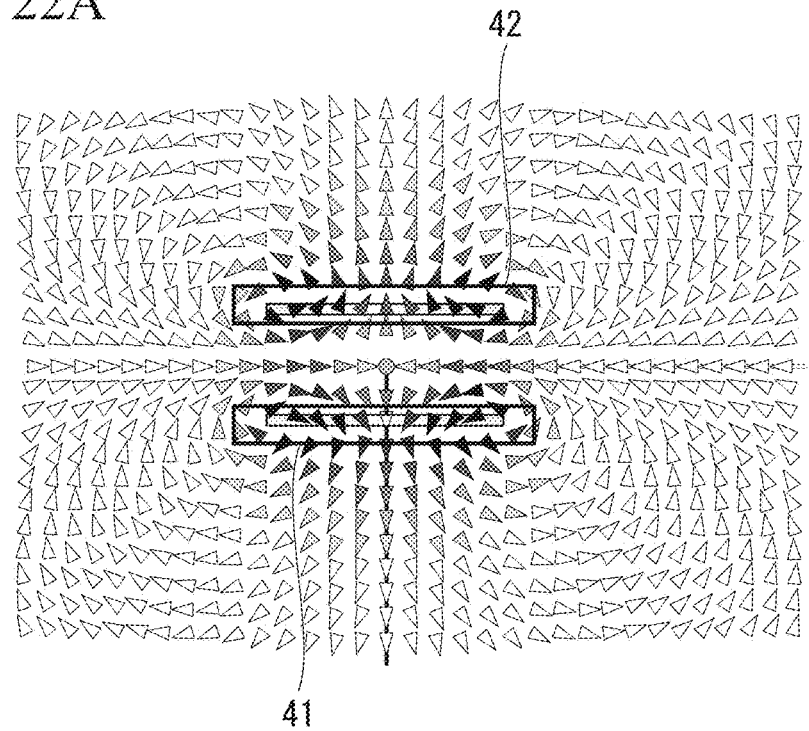
FIG. 22A is a diagram showing the magnetic field in close proximity to the transmission apparatus and the receiving apparatus, in the three dimensional electromagnetic field simulation of the first example of the present invention.
Figure 22B:
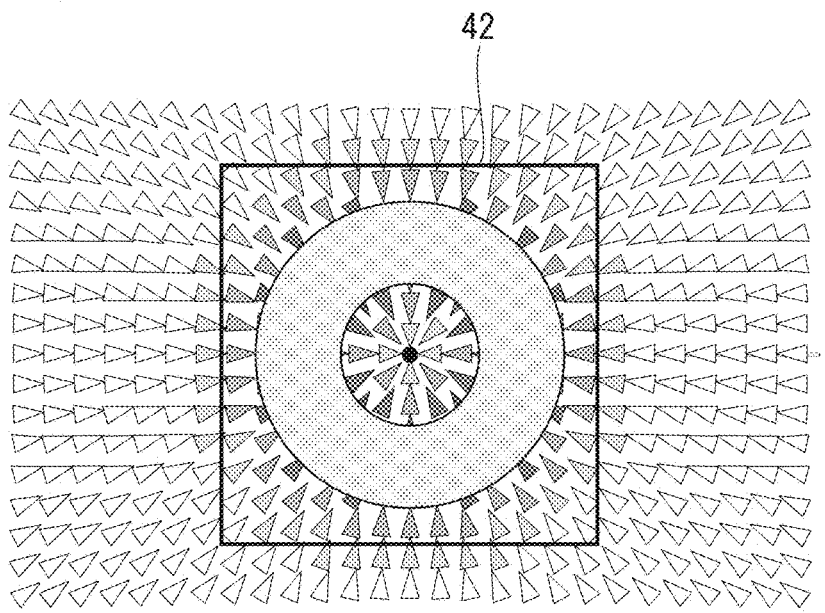
FIG. 22B is a diagram showing the magnetic field in close proximity to the transmission apparatus and the receiving apparatus, in the three dimensional electromagnetic field simulation of the first example of the present invention.

FIG. 22A and FIG. 22B are diagrams showing the magnetic field in close proximity to the transmission apparatus 41 and the receiving apparatus 42, in the three dimensional electromagnetic field simulation of the first example of the present invention. FIG. 22A shows a side sectional view. FIG. 22B shows a plane sectional view.

Figure 23A:
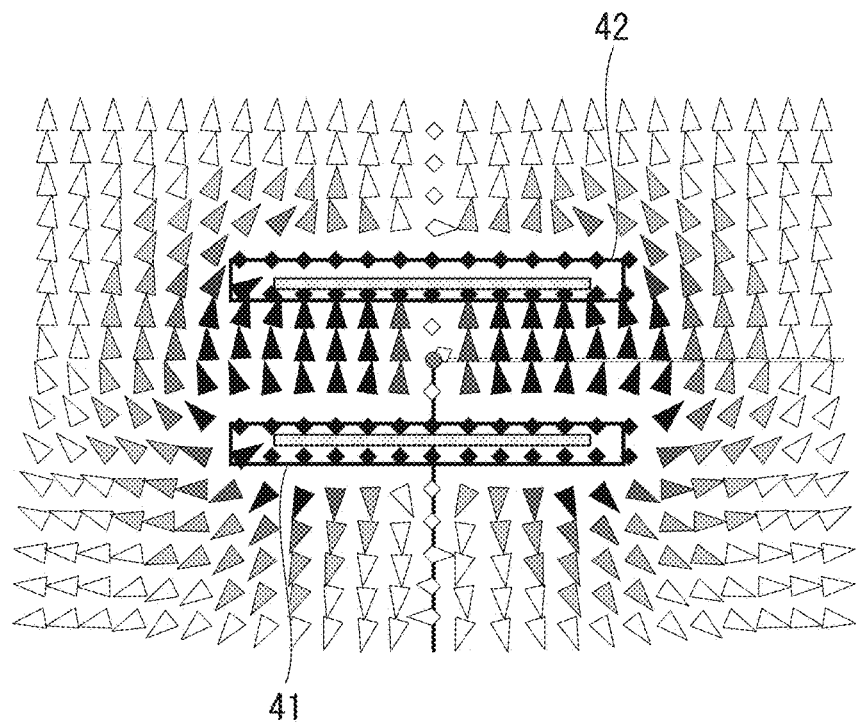
FIG. 23A is a diagram showing pointing vectors in close proximity to the transmission apparatus and the receiving apparatus, in the three dimensional electromagnetic field simulation of the first example of the present invention.
Figure 23B:
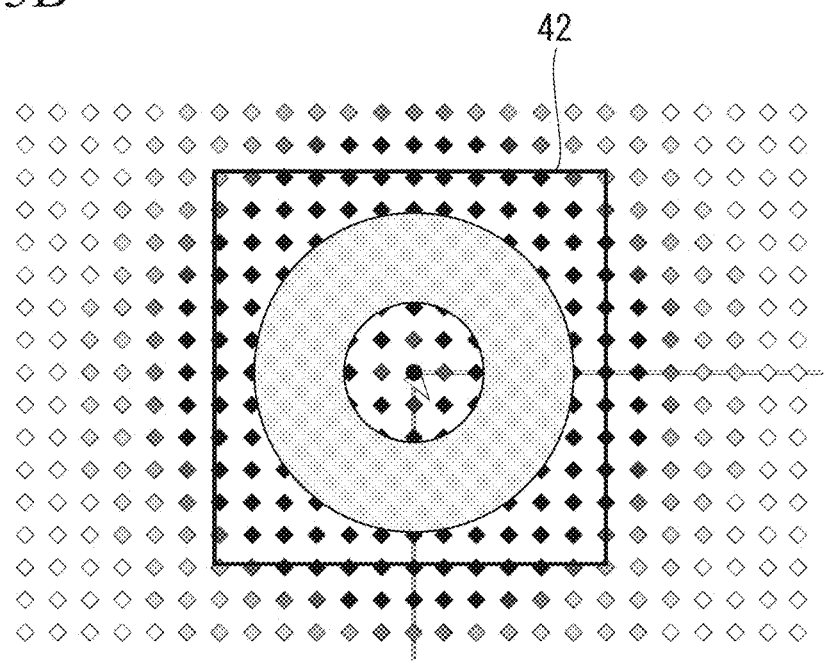
FIG. 23B is a diagram showing pointing vectors in close proximity to the transmission apparatus and the receiving apparatus, in the three dimensional electromagnetic field simulation of the first example of the present invention.

FIG. 23A and FIG. 23B are diagrams showing pointing vectors in close proximity to the transmission apparatus 41 and the receiving apparatus 42, in the three dimensional electromagnetic field simulation of the first example of the present invention. FIG. 23A shows a side sectional view. FIG. 23B shows a plane sectional view.

The electric field in close proximity to the transmission apparatus 41 and the receiving apparatus 42 in the three dimensional electromagnetic field simulation of the first example, is rotating along the plane parallel with the coil plane as shown in FIG. 21A and FIG. 21B. The magnetic field is generated in a radial manner along the plane parallel with the coil plane as shown in FIG. 22A and FIG. 22B. The pointing vector (energy flow) occurs in the direction substantially perpendicular to the coil plane as shown in FIG. 23A and FIG. 23B, based on the flow of these electric field and magnetic field. As a result, even in seawater where the transmission apparatus 41 and the receiving apparatus 42 are distanced from each other by approximately 10 cm, an energy flow is formed in the direction substantially perpendicular to the coil plane, and an increase in the distance in seawater becomes possible.

Figure 24A:
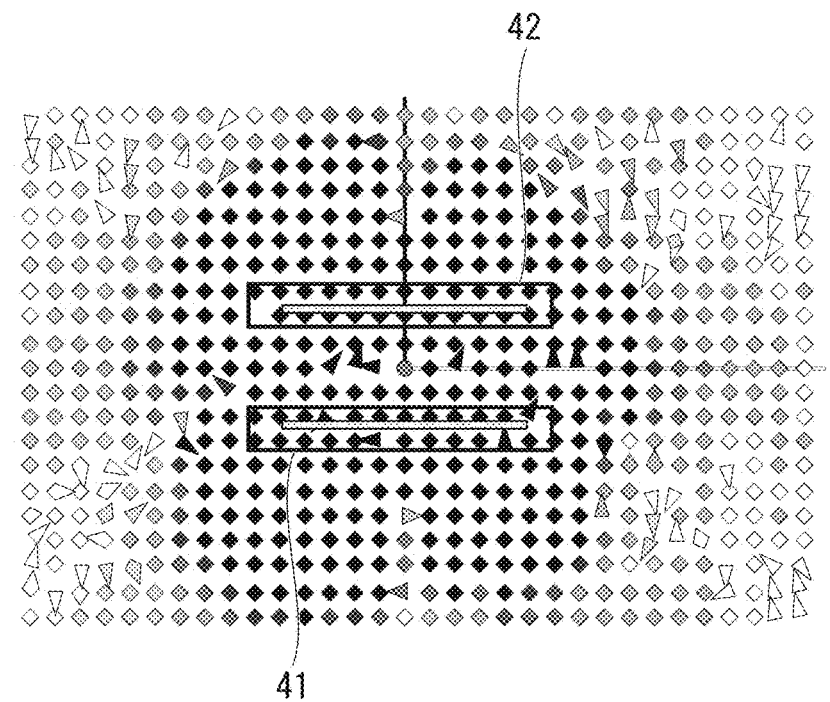
FIG. 24A is a diagram showing pointing vector simulation results in the case of changing the medium used in the power transmission system according to the first example of the present invention, from seawater to air.
Figure 24B:
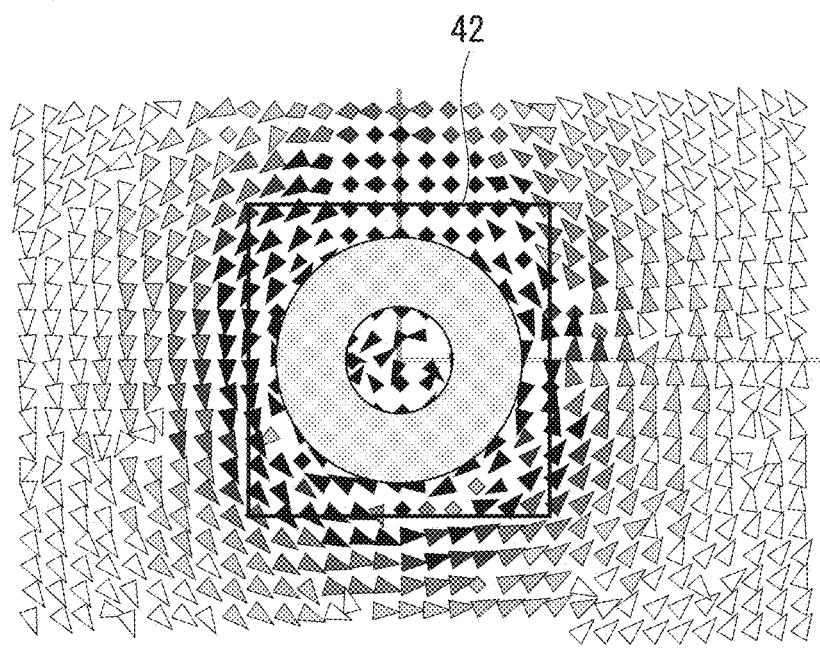
FIG. 24B is a diagram showing pointing vector simulation results in the case of changing the medium used in the power transmission system according to the first example of the present invention, from seawater to air.

FIG. 24A and FIG. 24B are diagrams showing pointing vector simulation results in the case of changing the medium used in the power transmission system 1 according to the first example of the present invention, from seawater to air. FIG. 24A shows a side sectional view. FIG. 24B shows a plane sectional view.

FIG. 24A and FIG. 24B show the pointing vector simulation results for when the transmission apparatus 41 and the receiving apparatus 42 of the power transmission system 1 of the present example are distanced from each other by 10 cm in air.

As can be seen from the FIG. 24A and FIG. 24B, when the medium used in the power transmission system 1 of the first example is changed from seawater to air, no energy flow that is perpendicular the transmission/receiving apparatus planes occurs, and energy flows in a spiral shape. That is to say, the phenomenon in which an energy flow that is substantially perpendicular to the coil plane occurs, is a phenomenon unique to energy that propagates in a good conductor medium, and it is a phenomenon that does not occur when propagation takes place in air. The exemplary embodiment of the present invention utilizes the phenomenon unique to energy that propagates in a good conductor medium in which energy flows substantially perpendicular to the coil plane.

Figure 25A:
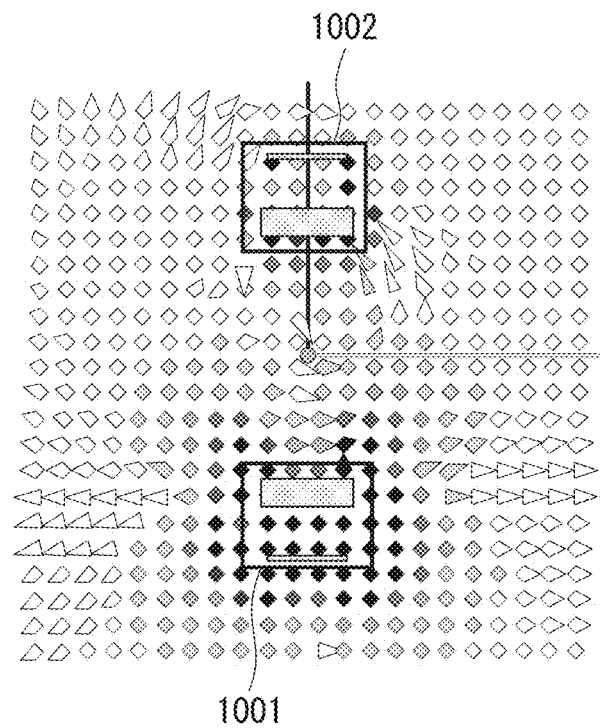
FIG. 25A is a diagram showing the results of a pointing vector simulation in air in the case of using a relevant magnetic field resonance technique.
Figure 25B:
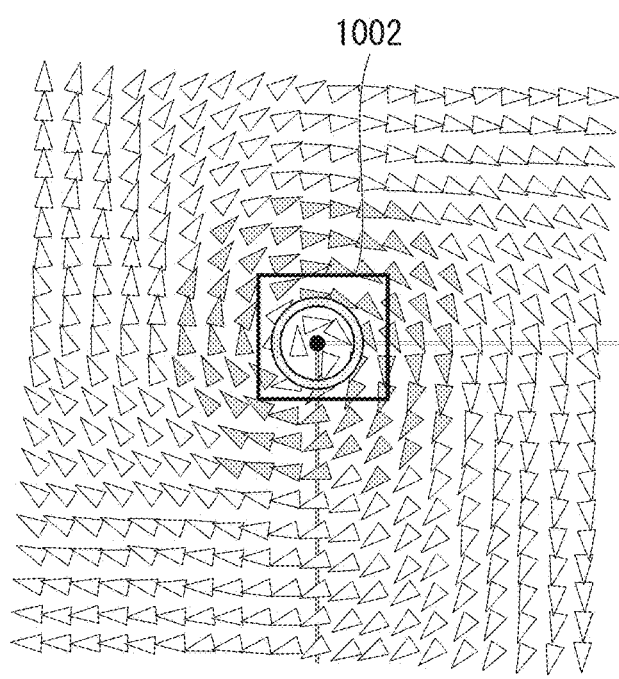
FIG. 25B is a diagram showing the results of a pointing vector simulation in air in the case of using the relevant magnetic field resonance technique.

FIG. 25A and FIG. 25B are diagrams showing the results of a pointing vector simulation in air in the case of using a relevant magnetic field resonance technique. FIG. 25A shows a side sectional view of a transmission apparatus 1001 and a receiving apparatus 1002. FIG. 25B shows a plane sectional view.

As can be seen from the FIG. 25A and FIG. 25B, also in the case of using the relevant magnetic field resonance technique, as with the case of FIG. 24A and FIG. 24B, no energy flow that is perpendicular the coil plane occurs, and energy flows in a spiral shape. However, the electric power transmission efficiency in the case of FIG. 25A and FIG. 25B is 90%. As has been described, even if wireless electric power transmission is carried out in seawater with use of the power transmission system of this relevant technique, a high level of electric power transmission efficiency cannot be achieved. Specifically, from the simulation results, it was revealed that an electric power transmission efficiency of only approximately 10% can be achieved with a 10 cm distance.

The magnetic field under the phase condition where the interlinkage magnetic flux that passes through the first coil of the transmission apparatus 1001 and the receiving apparatus 1002 of the second coil, is the same as the magnetic field in close proximity to the transmission apparatus 41 and the receiving apparatus 42 in the three dimensional electromagnetic field simulation of the present example shown in FIG. 22A and FIG. 22B.

Below is a description of the point of physical difference between the relevant magnetic field resonance technique and the power transmission system 1 of the present example.

In the power transmission system 1 of the present example, as shown in FIG. 22A and FIG. 22B, the interlinkage magnetic flux passing through the first coil 416 of the transmission apparatus 41, and the interlinkage magnetic flux passing through the second coil 426 of the receiving apparatus 42 are facing mutually opposite directions, and thereby, the magnetic field becomes a maximum and a magnetic field parallel with the coil plane is generated.

On the other hand, it is commonly known that in the relevant wireless power transmission technique that uses relevant magnetic field resonance, the resonance frequency is divided into two in the case of being closely coupled, and the phase of the interlinkage magnetic flux passing through the coil of the transmission apparatus 1001 and the receiving apparatus 1002 becomes a reversed phase at the higher resonance frequency. Moreover, it is commonly known that in the state of being loosely coupled where the resonance frequency is not divided, the phase of the interlinkage magnetic flux passing through the coil of the transmission apparatus 41 and the receiving apparatus 42 becomes the same phase.

The present example substantially differs from the relevant magnetic field resonance technique in that in the state of being loosely coupled where the resonance frequency is not divided, rather than being closely coupled, the phase of the interlinkage magnetic flux that passes through the first coil 416 of the transmission apparatus 41 and the second coil 426 of the receiving apparatus 42 becomes a reversed phase.

Figure 26A:
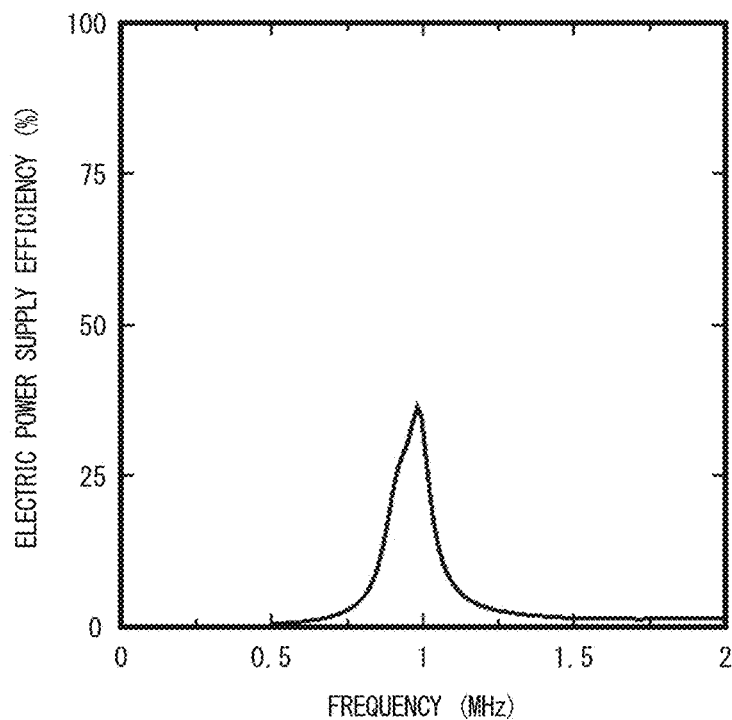
FIG. 26A is a diagram showing the results of actually experimenting in seawater, the effect of the power transmission system according to the first exemplary embodiment of the present invention.
Figure 26B:
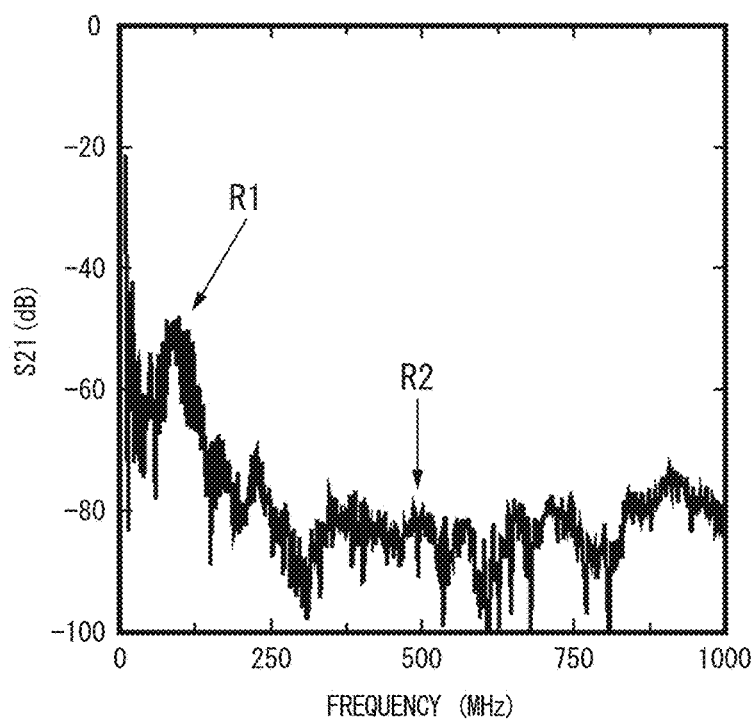
FIG. 26B is a diagram showing the results of actually experimenting in seawater, the effect of the power transmission system according to the first exemplary embodiment of the present invention.

FIG. 26A and FIG. 26B are diagrams showing the results of actually experimenting in seawater, of the effect of the power transmission system 1 according to the first exemplary embodiment of the present invention. FIG. 26A shows the result of the case of low frequency (power supply applications). FIG. 26B shows the result of the case of high frequency (communication applications). In FIG. 26B, arrow R1 shows the portion for communication applications. Arrow R2 shows noise level.

The distance d between the transmission apparatus 41 and the receiving apparatus 42 is 10 cm. When power supply was performed at a low frequency (approximately 1 MHz), the electric power transmission efficiency took a high value of 30% or more. Moreover, when communication was performed at a high frequency (approximately 90 MHz), a signal intensity that was higher than the noise level by 30 dB or more was achieved, and also, a fractional bandwidth of several MHz or more could be achieved. Therefore, it is possible to perform communication of a high communication rate.

Second Example

Figure 27:
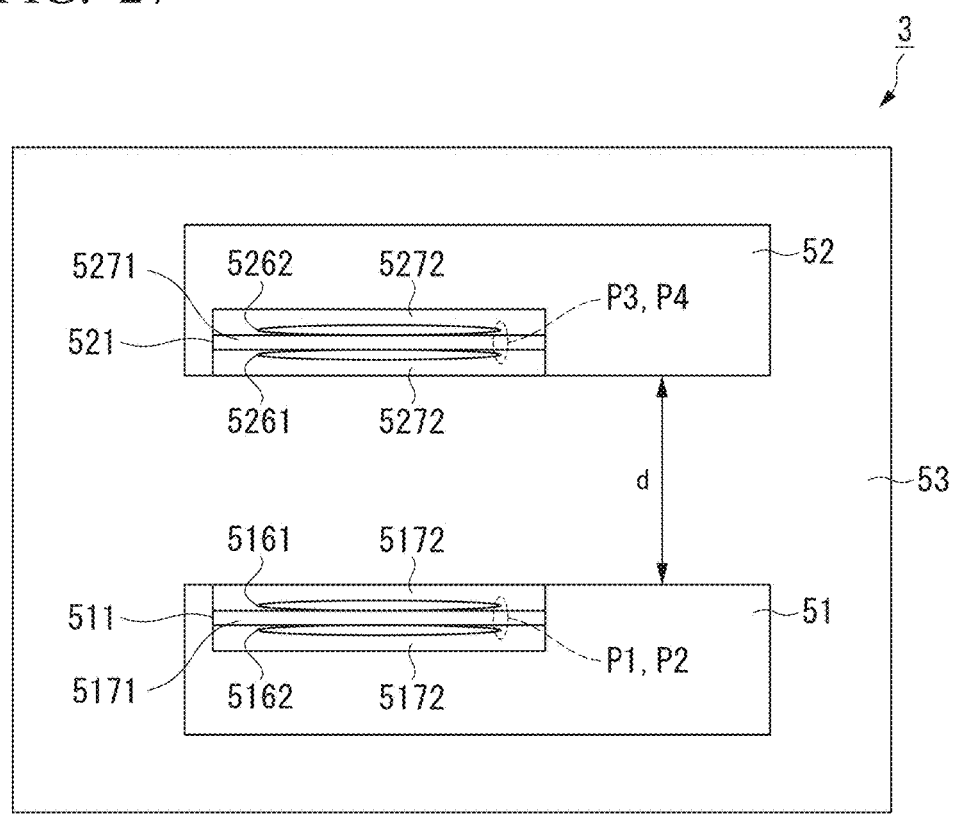
FIG. 27 is a diagram showing a simulation model for verifying the effect of the power transmission system according to the third exemplary embodiment of the present invention.

FIG. 27 is a diagram showing a simulation model for verifying the effect of the power transmission system 3 according to the third exemplary embodiment of the present invention.

Here is described a simulation that has verified the effect of the power transmission system 3 according to the third exemplary embodiment, that uses the simulation model of FIG. 27.

As shown in FIG. 27, the power transmission system 3 of the third exemplary embodiment includes a transmission apparatus 51 and a receiving apparatus 52. The transmission apparatus 51 and the receiving apparatus 52 are covered by a good conductor medium 53. The transmission apparatus 51 includes a first antenna 511. The first antenna 511 includes a first lower coil 5161, a first upper coil 5162, a first primary containment unit 5171, and a first secondary containment unit 5172. The first primary containment unit 5171 includes a first dielectric body that covers the first lower coil 5161 and the first upper coil 5162. The first secondary containment unit 5172 includes a second dielectric body that covers the first primary containment unit 5171. The receiving apparatus 52 includes a second antenna 521. The second antenna 521 includes a second lower coil 5261, a second upper coil 5262, a second primary containment unit 5271, and a second secondary containment unit 5272. The second primary containment unit 5271 includes a first dielectric body that covers the second lower coil 5261 and the second upper coil 5262. The second secondary containment unit 5272 includes a second dielectric body that covers the second primary containment unit 5271.

As shown in FIG. 27, the simulation model in the present example is of a structure in which the first secondary containment unit 5172 covers only the upper plane and lower plane of the first primary containment unit 5171 (planes parallel with the coil plane). That is to say, the first primary containment unit 5171 is sandwiched by the two first secondary containment units 5172. On the other hand, the side plane of the first primary containment unit 5171 (plane perpendicular to the coil plane) is covered directly by the transmission apparatus 51. Moreover, the simulation model in the present example is such that the second secondary containment unit 5272 covers only the upper plane and lower plane of second primary containment unit 5271. That is to say, the second primary containment unit 5271 is sandwiched by the two second secondary containment units 5272. On the other hand, the side plane of the second primary containment unit 5271 is covered directly by the receiving apparatus 52.

Figure 28:
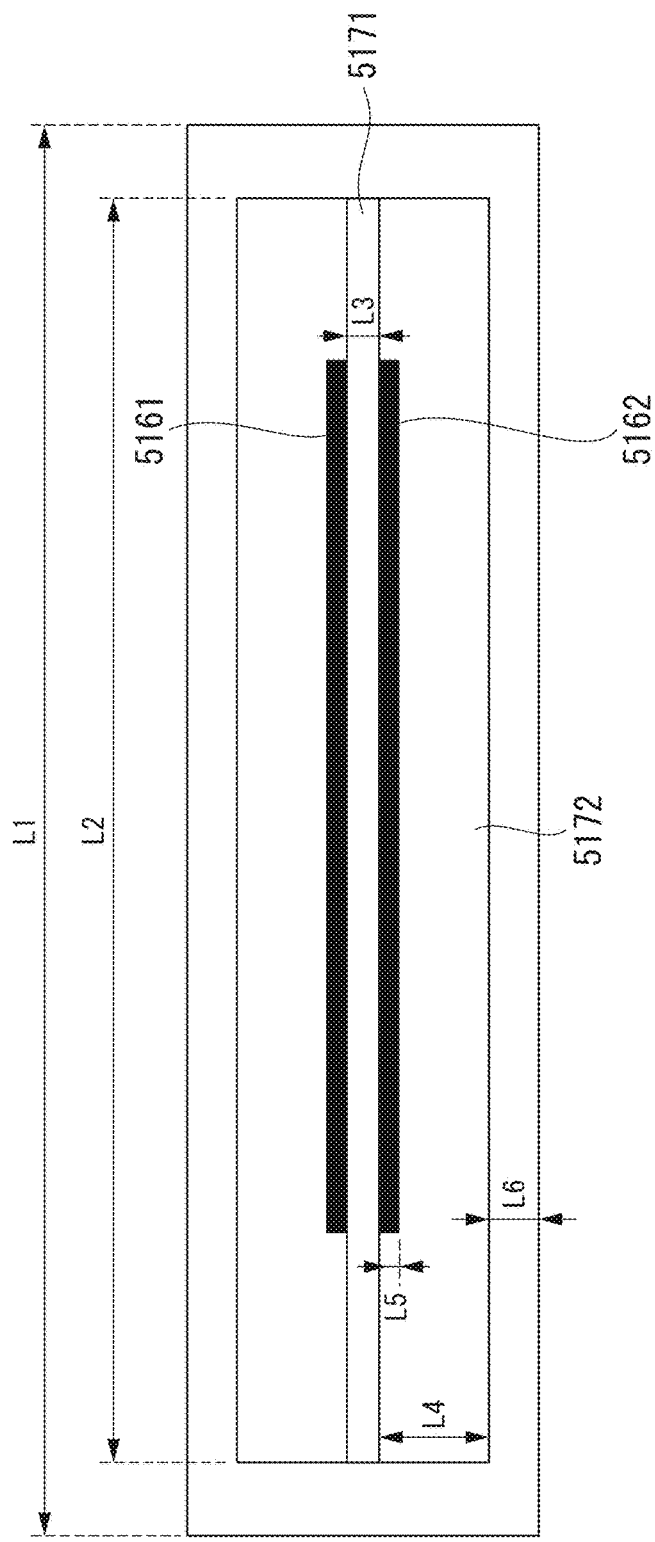
FIG. 28 is a schematic side view of a transmission apparatus in a second example of the present invention.

FIG. 28 is a schematic side view of the transmission apparatus 51 in the second example of the present invention. In FIG. 28, length L1 is 260 mm, length L2 is 250 mm, length L3 is 0.5 mm, length L4 is 2.5 mm, length L5 is 1 mm, and length L6 is 5 mm.

The dimensions of the first primary containment unit 5171 are 250 mm long, 250 mm wide, and 0.5 mm high. The first primary containment unit 5171 is composed of a fluorine resin. The relative permittivity of the first primary containment unit 5171 is 6.2, and the dielectric loss tangent is 0.0019.

The first secondary containment unit 5172 is configured with two pieces of 250 mm long, 250 mm wide, and 2.5 mm high fluorine resins. The relative permittivity of the first secondary containment unit 5172 is 10.2, and the dielectric loss tangent is 0.0024.

The dimensions of the transmission apparatus 51 are 260 mm long, 260 mm wide, 26.5 mm high, and 5 mm thick. The transmission apparatus 51 is composed of an acrylic material. The relative permittivity of the acrylic material is 3.3, and the dielectric loss tangent is 0.04.

In the present example, a simulation is performed where the receiving apparatus 52 is also of the same configuration as that of the transmission apparatus 51 described above.

Figure 29:
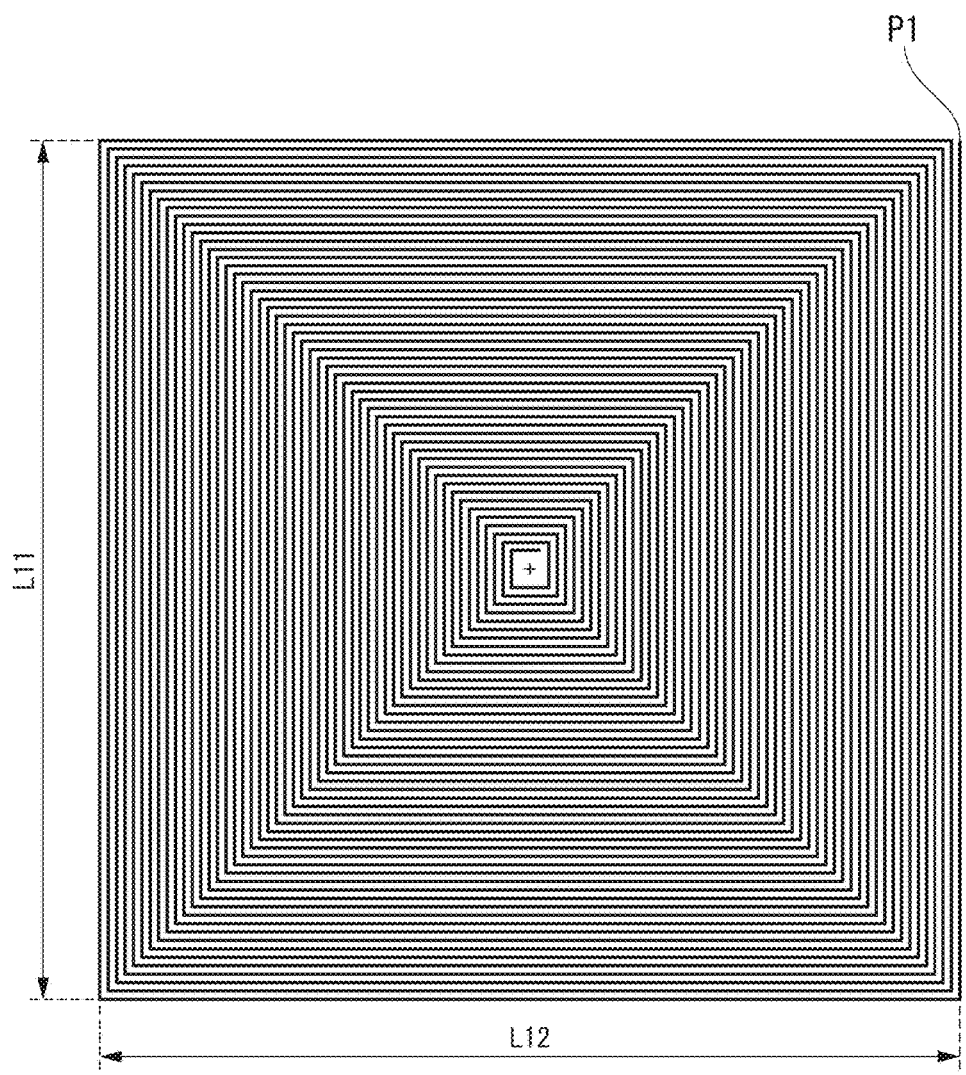
FIG. 29 is a diagram of a power transmission side lower coil of the transmission apparatus in the second example of the present invention, viewed from a receiving apparatus side.

FIG. 29 is a diagram of the first lower coil 5161 of the transmission apparatus 51 in the second example of the present invention, viewed from the receiving apparatus 52 side. The first lower coil 5161 has a power supply port P1. In FIG. 29, length L11 and length L12 are 208 mm.

Figure 30:
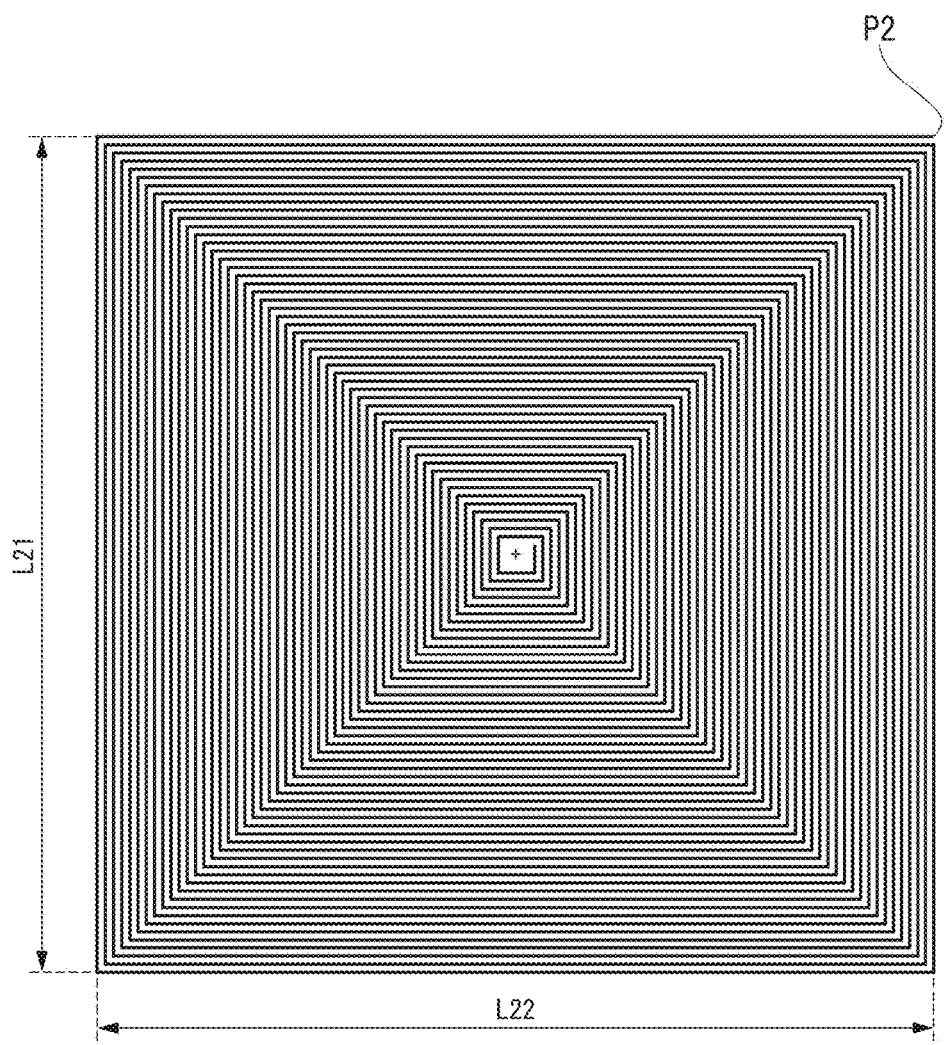
FIG. 30 is a diagram of a power transmission side upper coil of the transmission apparatus in the second example of the present invention, viewed from the receiving apparatus side.

Moreover, FIG. 30 is a diagram of the first upper coil 5162 of the transmission apparatus 51 in the second example of the present invention, viewed from the receiving apparatus 52 side. The first upper coil 5162 has a power supply port P2. In FIG. 30, length L21 and length L22 are 208 mm.

The first lower coil 5161 is a spiral coil that is configured with wiring composed of a conductor wound 50 times with a 208 mm outer edge length. The diameter of the wire of the first lower coil 5161 is 1 mm, and intervals of the wires are 1 mm.

The first upper coil 5162 is of the same size as that of the first lower coil 5161. The first lower coil 5161 and the first upper coil 5161 are arranged apart by 0.5 mm. The outermost circumference end part of the first lower coil 5161 and the outermost circumference end part of the first upper coil 5162 serve as the power supply ports P1 and P2 for high frequency electric power. The orientation of the spiral of the first lower coil 5161 and the orientation of the spiral of the first upper coil 5162 are configured to be the orientations in which a magnetic field is generated in the same direction via the power supply ports P1 and P2.

Figure 31:
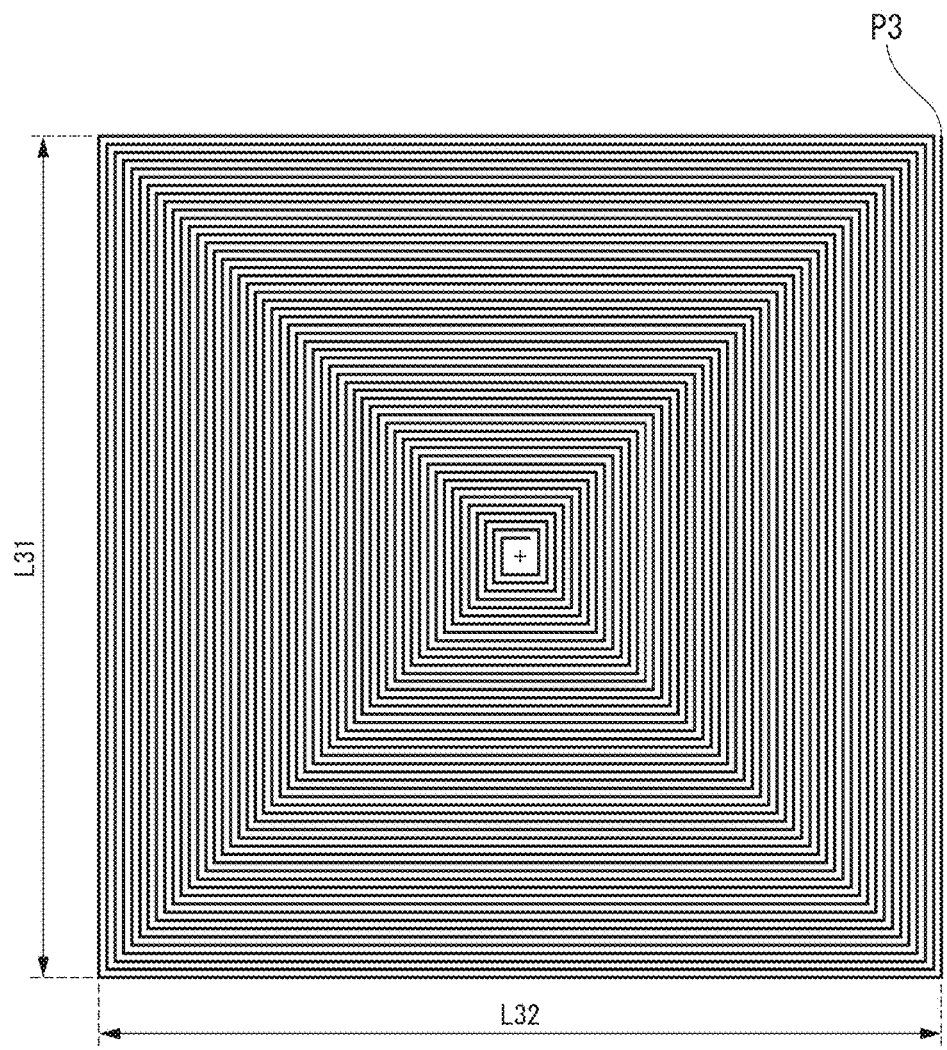
FIG. 31 is a diagram of a power receiving side lower coil of a receiving apparatus in the second example of the present invention, viewed from a transmission apparatus side.

FIG. 31 is a diagram of the second lower coil 5261 of the receiving apparatus 52 in the second example of the present invention, viewed from the transmission apparatus 51 side. The second lower coil 5261 has a power supply port P3. In FIG. 29, length L31 and length L32 are 208 mm.

Figure 32:
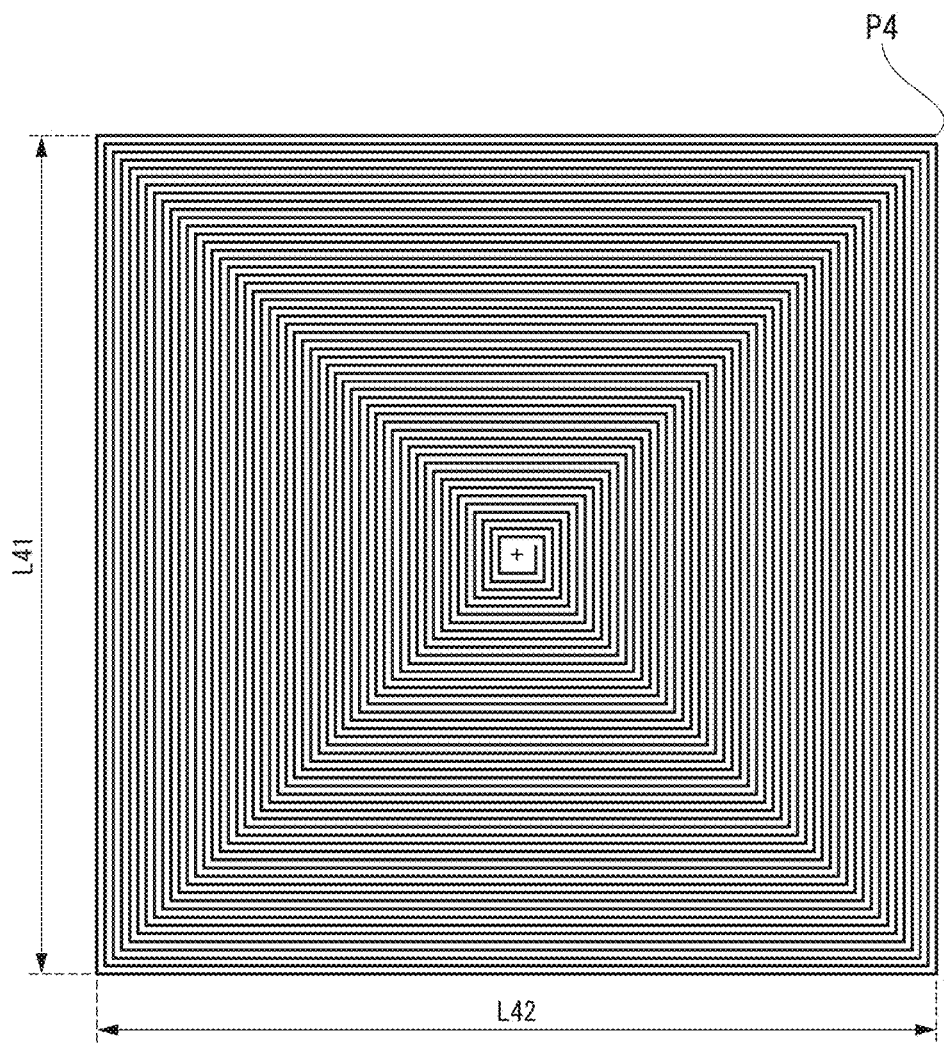
FIG. 32 is a diagram of a power receiving side upper coil of the receiving apparatus in the second example of the present invention, viewed from the transmission apparatus side.

FIG. 32 is a diagram of the second upper coil 5262 of the receiving apparatus 52 in the second example of the present invention, viewed from the transmission apparatus 51 side. The second upper coil 5262 has a power supply port P4. In FIG. 32, length L31 and length L32 are 208 mm.

The second lower coil 5261 is a spiral coil that is configured with wiring composed of a conductor wound 50 times with a 208 mm outer edge length. The diameter of the wire of the second lower coil 5261 is 1 mm, and intervals of the wires are 1 mm.

The second upper coil 5262 is of the same size as that of the second lower coil 5261. The second lower coil 5261 and the second upper coil 5161 are arranged apart by 0.5 mm. The outermost circumference end part of the second lower coil 5261 and the outermost circumference end part of the second upper coil 5262 serve as the power supply ports P3 and P4 for high frequency electric power. The orientation of the spiral of the second lower coil 5261 and the orientation of the spiral of the second upper coil 5262 are configured to be the orientations in which a magnetic field is generated in the same direction via the power supply ports P3 and P4.

Figure 33:
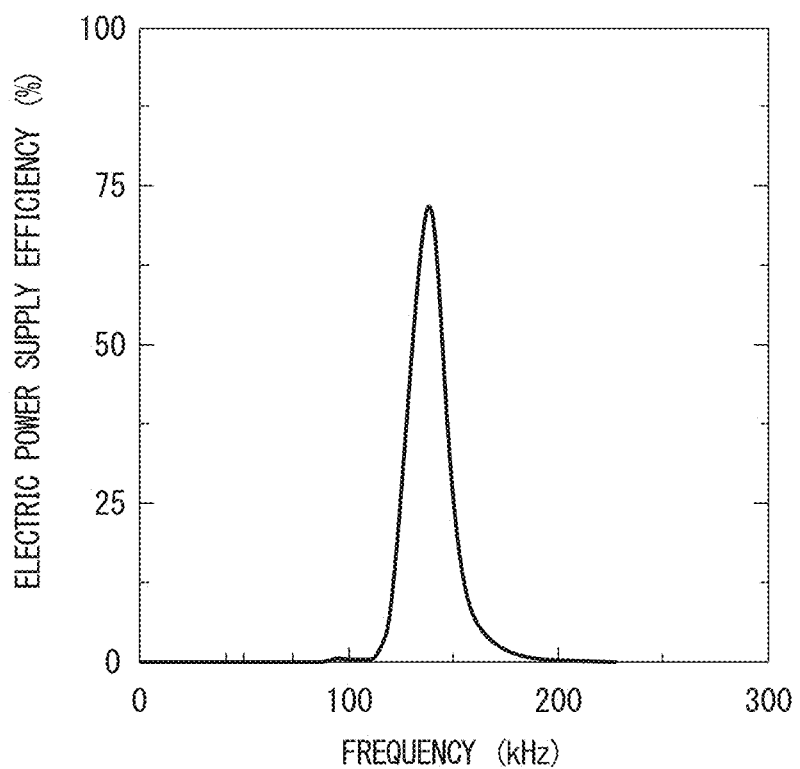
FIG. 33 is a diagram showing electric power transmission efficiency simulation results in the second example of the present invention.

FIG. 33 is a diagram showing electric power transmission efficiency simulation results in the second example of the present invention.

In the case where the transmission apparatus 51 and the receiving apparatus 52 were apart by 10 cm in seawater, the electric power transmission efficiency simulation result was a high value of 72% or more as shown in FIG. 33. The resonance frequency was approximately 140 kHz.

The configuration of the receiving apparatus 52 in the present example was the same as that of the transmission apparatus 51. However, the configuration shown here is merely an example, and the transmission apparatus 51 and the receiving apparatus 52 need not be of the same configuration.

Figure 34:
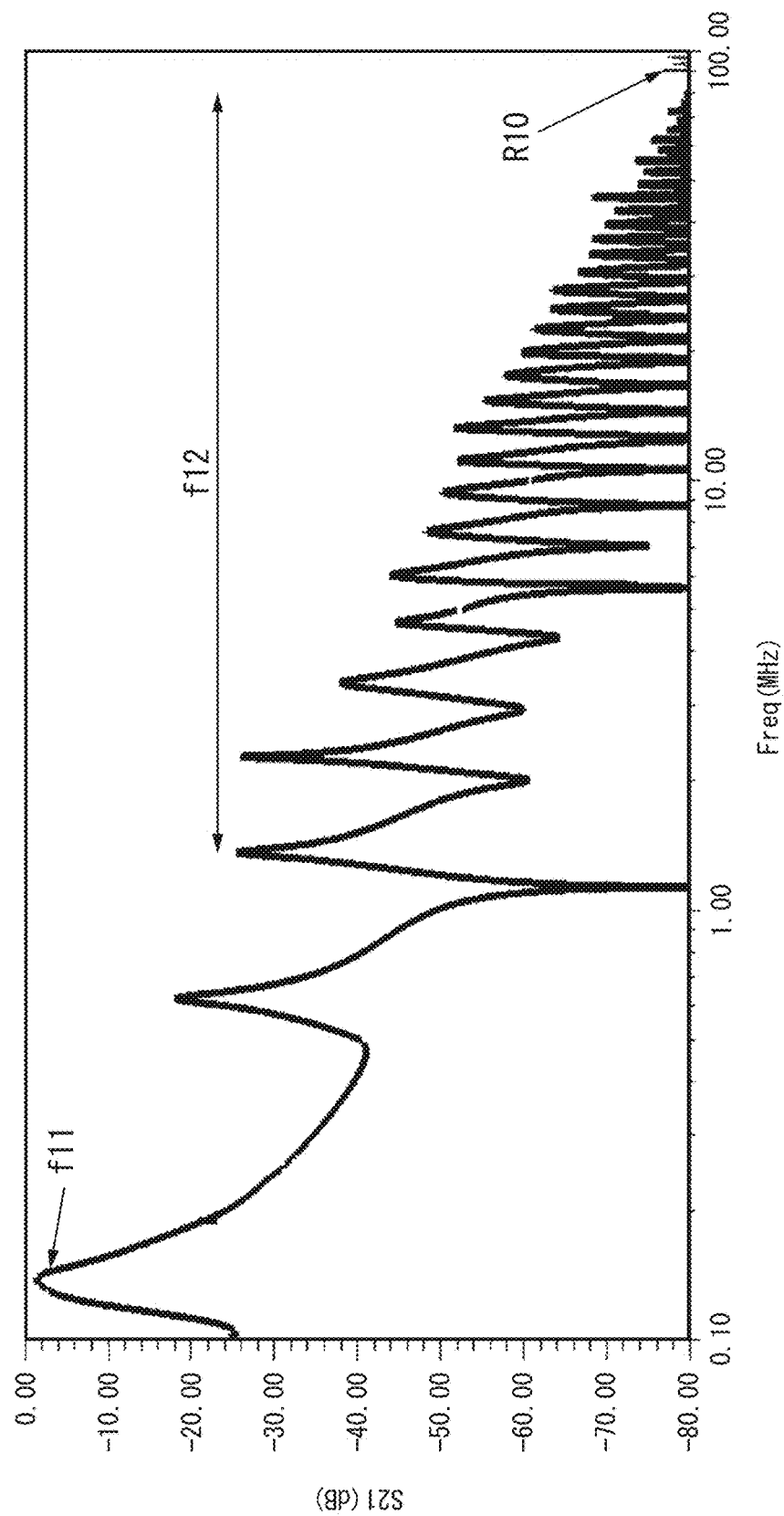
FIG. 34 is a diagram showing simulation results of an S parameter (S21) in the second example of the present invention.

FIG. 34 is a diagram showing simulation results of an S parameter (S21) in the second example of the present invention. Arrow R10 shows noise level.

S21 of the S parameter is defined by the ratio (electric power reflected from input terminal/electric power irradiated on input terminal). FIG. 34 shows power supply frequency (f11) as well as communication frequency (f21). A higher level of S/N ratio is obtained at communication frequency (f12) of the frequency band (f11×10 to f11×1,000) that is 10 to 1,000 times the power supply frequency (f11). Using these power supply frequency (f11) and the communication frequency (f12), the power transmission system 3 can perform electric power supply at a high level of electric power transmission efficiency, and communication at a high level of communication rate.

As shown in the simulation of the present example, by providing the configuration with several dielectric bodies for coating the coil, it is possible, without increasing loss in the dielectric bodies, to lower the frequency and achieve a high level of electric power transmission efficiency.

The invention of the present application has been described with reference to the exemplary embodiments and examples. However, the invention of the present application is not limited to the above exemplary embodiments and examples. As will be understood by those skilled in the art, various modifications may be made to the configuration and/or details of the invention without departing from the scope of the invention defined by the claims.

Part or all of the above exemplary embodiments may be stated in the following supplementary notes, however, they are not limited to the supplementary notes.

(Supplementary note 1) A power transmission system including a transmission apparatus and a receiving apparatus, wherein the transmission apparatus includes:

a first antenna; and a first power transmission circuit that outputs electric power via the first antenna, the electric power having a first resonance frequency determined by an impedance of a medium, an impedance of the first antenna, and an impedance of a second antenna, the medium being present between the transmission apparatus and the receiving apparatus, and the receiving apparatus includes:

the second antenna; and a second power transmission circuit that receives, via the second antenna, the electric power outputted by the transmission apparatus.

(Supplementary note 2) The power transmission system according to supplementary note 1, wherein the transmission apparatus further includes a first wireless communication circuit that outputs a communication signal via the first antenna, the communication signal having a second resonance frequency determined by the impedance of the medium, the impedance of the first antenna, and the impedance of the second antenna, and the receiving apparatus further includes a second wireless communication circuit that receives, via the second antenna, the communication signal outputted by the transmission apparatus.

(Supplementary note 3) The power transmission system according to supplementary note 1, wherein the first antenna includes a first coil and a first containment unit, the first containment unit including a dielectric body that covers the first coil, and the second antenna includes a second coil and a second containment unit, the second containment unit including a dielectric body that covers the second coil.

(Supplementary note 4) The power transmission system according to supplementary note 2, wherein a ratio of the second resonance frequency to the first resonance frequency is higher than 10 and lower than 1,000.

(Supplementary note 5) The power transmission system according to any one of supplementary notes 1 to 4, wherein in a case where a capacitance component that forms the impedance of the first antenna is expressed as $C1$, a capacitance component that forms the impedance of the second antenna is expressed as $C2$, a capacitance component of a capacitance that is formed with the first antenna, the second antenna, and the medium that is present between the first antenna and the second antenna is expressed as $C3$, and a distance between the first antenna and the second antenna is expressed as $d$, a relationship of $30\text{ cm} > C3 \times d/(C1+C2) > 0.5\text{ cm}$ is satisfied.

(Supplementary note 6) The power transmission system according to any one of supplementary notes 1 to 4, wherein the first power transmission circuit includes an impedance adjustment unit that is configured to vary an impedance of the first power transmission circuit.

(Supplementary note 7) The power transmission system according to any one of supplementary notes 1 to 4, wherein the second power transmission circuit includes an impedance adjustment unit that is configured to vary an impedance of the second power transmission circuit.

(Supplementary note 8) The power transmission system according to any one of supplementary notes 1 to 4, wherein the first power transmission circuit includes a first impedance adjustment unit that is configured to vary a capacitance component of the first power transmission circuit, the second power transmission circuit includes a second impedance adjustment unit that is configured to vary a capacitance component of the second power transmission circuit, and in a case where a combined capacitance component of a capacitance component that forms the impedance of the first antenna and a capacitance component of the first power transmission circuit is expressed as $C10$, and a combined capacitance component of a capacitance component that forms the impedance of the second antenna and a capacitance component of the second power transmission circuit is expressed as $C20$, a relationship of $30\text{ cm} > C3 \times d/(C10+C20) > 0.5\text{ cm}$ is satisfied.

(Supplementary note 9) The power transmission system according to supplementary note 3, wherein a ratio of a size of the first containment unit in a direction along a coil plane to an outer diameter of the first coil is greater than 1.2.

(Supplementary note 10) The power transmission system according to supplementary note 3, wherein a ratio of a size of the second containment unit in a direction along a coil plane to an outer diameter of the second coil is greater than 1.2.

(Supplementary note 11) The power transmission system according to supplementary note 3, wherein the first containment unit includes:

a first containment unit including a first dielectric body that covers the first coil; and a first secondary containment unit including a second dielectric body that covers the first primary containment unit, and the second containment unit includes:

a second primary containment unit including a first dielectric body that covers the second coil; and a second secondary containment unit including a second dielectric body that covers the second primary containment unit.

(Supplementary note 12) The power transmission system according to supplementary note 11, wherein a dielectric loss tangent of the first dielectric body is lower than or equal to a dielectric loss tangent of the second dielectric body.

(Supplementary note 13) The power transmission system according to supplementary note 12, wherein a relative permittivity of the first dielectric body is lower than or equal to a relative permittivity of the second dielectric body.

(Supplementary note 14) The power transmission system according to any one of supplementary notes 1 to 13, wherein the medium has its electric conductivity higher than $1 \times 10^{-4}$, and its relative permittivity higher than 1.

(Supplementary note 15) The power transmission system according to any one of supplementary notes 1 to 14, wherein the medium is any one of seawater, river water, fresh water, tap water, soil, and concrete.

(Supplementary note 16) The power transmission system according to any one of supplementary notes 1 to 15, wherein at least a part of an electric field generated in the medium rotates substantially parallel with a first coil plane of the transmission apparatus or a second coil plane of the receiving apparatus, and at least a part of a magnetic field generated in the medium is oriented substantially parallel with the first coil plane of the transmission apparatus or the second coil plane of the receiving apparatus.

(Supplementary note 17) The power transmission system according to supplementary note 16, wherein an interlinkage magnetic flux passing through the first coil of the transmission apparatus and an interlinkage magnetic flux passing through the second coil of the receiving apparatus face mutually opposite directions under a phase condition where magnetic field becomes a maximum, and thereby, a magnetic field parallel with the coil plane is generated.

(Supplementary note 18) The power transmission system according to supplementary note 2, wherein the transmission apparatus includes a first control circuit that controls which one of the first power transmission circuit and the first wireless communication circuit is to be connected to the first antenna, and the receiving apparatus includes a second control circuit that controls which one of the second power transmission circuit and the second wireless communication circuit is to be connected to the second antenna.

(Supplementary note 19) The power transmission system according to supplementary note 2 or 18, wherein the transmission apparatus includes:

a first switching circuit that connects the first power transmission circuit to the first antenna when electric power transmission is performed; and a second switching circuit that connects the second wireless communication circuit to the first antenna when wireless communication is performed, and the receiving apparatus includes:

a first switching circuit that connects the second power transmission circuit to the second antenna when electric power transmission is performed, and a second switching circuit that connects the second wireless communication circuit to the second antenna when wireless communication is performed.

(Supplementary note 20) A transmission apparatus for transmitting electric power via a medium that is present between the transmission apparatus and a receiving apparatus, the transmission apparatus including:

an antenna; and a power transmission circuit that outputs electric power via the antenna of the transmission apparatus, the electric power having a first resonance frequency determined by an impedance of the medium, an impedance of the antenna of the transmission apparatus, and an impedance of an antenna of the receiving apparatus.

(Supplementary note 21) A receiving apparatus for receiving electric power via a medium that is present between a transmission apparatus and the receiving apparatus, the receiving apparatus including:

an antenna; and a power transmission circuit that receives electric power from the transmission apparatus via the antenna of the receiving apparatus, the electric power having a first resonance frequency determined by an impedance of the medium, an impedance of an antenna of the transmission apparatus, and an impedance of the antenna of the receiving apparatus.

(Supplementary note 22) A power transmission method for a transmission apparatus and a receiving apparatus, the power transmission method including:

outputting electric power via an antenna of the transmission apparatus, the electric power having a first resonance frequency determined by an impedance of a medium, an impedance of the antenna of the transmission apparatus, and an impedance of an antenna of the receiving apparatus, the medium being present between the transmission apparatus and the receiving apparatus; and receiving the output electric power via the antenna of the receiving apparatus.

(Supplementary note 23) A power transmission method for a transmission apparatus that transmits electric power via a medium that is present between the transmission apparatus and a receiving apparatus, the power transmission method including:

outputting electric power via an antenna of the transmission apparatus, the electric power having a first resonance frequency determined by an impedance of the medium, an impedance of the antenna of the transmission apparatus, and an impedance of an antenna of the receiving apparatus.

(Supplementary note 24) A power transmission method for a receiving apparatus that receives electric power via a medium that is present between a transmission apparatus and the receiving apparatus, the power transmission method including:

receiving electric power via an antenna of the receiving apparatus, the electric power having a first resonance frequency determined by an impedance of the medium, an impedance of an antenna of the transmission apparatus, and an impedance of the antenna of the receiving apparatus.

This application is based upon and claims the benefit of priority from Japanese patent application No. 2013-031024, filed Feb. 20, 2013, the disclosure of which is incorporated herein in its entirety by reference.

INDUSTRIAL APPLICABILITY

The present invention may be applied to a power transmission system, a transmission apparatus, a receiving apparatus, and a power transmission method.

REFERENCE SYMBOLS 1, 2, 3, 4 Power transmission system
11, 21, 31, 51 Transmission apparatus
12, 22, 32, 42, 52 Receiving apparatus
13, 23, 33, 53 Good conductor medium (medium)
14 Sensor
15, 16, 17 Submarine
18, 19 Power cable
41 Transmission apparatus (coated dielectric body)
43 Seawater
111, 211, 311, 411, 511 Power transmission side antenna (first antenna)
112, 212, 312 Power transmission side power transmission circuit (first power transmission circuit)
113, 213, 313 Power transmission side wireless communication circuit (first wireless communication circuit)
114, 214, 314 Power transmission side control circuit (first control circuit)
116, 216, 416 Power transmission side coil (first coil)
117 Power transmission side containment unit (first containment unit)
118, 218, 318 Power transmission side switching circuit (first switching circuit)
119, 219, 319 Power transmission side impedance adjustment unit (first impedance adjustment unit)

121, 221, 321, 421, 521 Power receiving side antenna (second antenna)
122, 222, 322 Power receiving side power transmission circuit (second power transmission circuit)
123, 223, 323 Power receiving side wireless communication circuit (second wireless communication circuit)
124, 224, 324 Power receiving side control circuit (second control circuit)
125, 225, 325 Secondary battery
126, 226, 326 Power receiving side coil (second coil)
127 Power receiving side containment unit (second containment unit)
128, 228, 328 Power receiving side switching circuit (second switching circuit)
129, 229, 329 Power receiving side impedance adjustment unit (second impedance adjustment unit)
417 Power transmission side primary containment unit (first primary containment unit, internal dielectric body)
427, 2271, 3271, 5271 Power receiving side primary containment unit (second primary containment unit)
2171, 3171, 5171 Power transmission side primary containment unit (first primary containment unit)
2172, 3172, 5172 Power transmission side secondary containment unit (first secondary containment unit)
2272, 3272, 5272 Power receiving side secondary containment unit (second secondary containment unit)
3161, 5161 Power transmission side lower coil (first lower coil)
3162, 5162 Power transmission side upper coil (first upper coil)
3261, 5261 Power receiving side lower coil (second lower coil)
3262, 5262 Power receiving side upper coil (second upper coil)

What is claimed is:

1. A power transmission system comprising a transmission apparatus and a receiving apparatus, wherein the transmission apparatus comprises:
a first antenna; and
a first power transmission circuit that outputs electric power via the first antenna, the electric power having a first resonance frequency determined by an impedance of a medium, an impedance of the first antenna, and an impedance of a second antenna, the medium being present between the transmission apparatus and the receiving apparatus, the medium having an electric conductivity higher than $1\times10^{-4}$ Siemens per meter and having a relative permittivity higher than 1, wherein the receiving apparatus comprises:
the second antenna; and
a second power transmission circuit that receives, via the second antenna, the electric power outputted by the transmission apparatus, wherein the first antenna comprises:
a first coil;
a first dielectric body that covers a perimeter of the first coil; and
a second dielectric body that covers a perimeter of the first dielectric body, and wherein
a dielectric loss tangent of the second dielectric body is greater than a dielectric loss tangent of the first dielectric body.

2. The power transmission system according to claim 1, wherein
the transmission apparatus further comprises a first wireless communication circuit that outputs a communication signal via the first antenna, the communication signal having a second resonance frequency determined by the impedance of the medium, the impedance of the first antenna, and the impedance of the second antenna, and
the receiving apparatus further comprises a second wireless communication circuit that receives, via the second antenna, the communication signal outputted by the transmission apparatus.

3. The power transmission system according to claim 1, wherein
the second antenna comprises a second coil and a second containment unit, the second containment unit comprising a dielectric body that covers the second coil.

4. The power transmission system according to claim 2, wherein a ratio of the second resonance frequency to the first resonance frequency is higher than 10 and lower than 1,000.

5. The power transmission system according to claim 1, wherein
in a case where a capacitance component that forms the impedance of the first antenna is expressed as C1, a capacitance component that forms the impedance of the second antenna is expressed as C2, a capacitance component of a capacitance that is formed with the first antenna, the second antenna, and the medium that is present between the first antenna and the second antenna is expressed as C3, and a distance between the first antenna and the second antenna is expressed as d,
a relationship of 30 cm>C3×d/(C1+C2)>0.5 cm is satisfied.

6. The power transmission system according to claim 1, wherein the first power transmission circuit comprises an impedance adjustment unit that is configured to vary an impedance of the first power transmission circuit.

7. The power transmission system according to claim 1, wherein the second power transmission circuit comprises an impedance adjustment unit that is configured to vary an impedance of the second power transmission circuit.

8. The power transmission system according to claim 1, wherein
the first power transmission circuit comprises a first impedance adjustment unit that is configured to vary a capacitance component of the first power transmission circuit,
the second power transmission circuit comprises a second impedance adjustment unit that is configured to vary a capacitance component of the second power transmission circuit, and
in a case where: a capacitance component of a capacitance that is formed with the first antenna, the second antenna, and the medium that is present between the first antenna and the second antenna is expressed as C3; a distance between the first antenna and the second antenna is expressed as d; a combined capacitance component of a capacitance component that forms the impedance of the first antenna and a capacitance component of the first power transmission circuit is expressed as C10; and a combined capacitance component of a capacitance component that forms the impedance of the second antenna and a capacitance component of the second power transmission circuit is expressed as C20,
a relationship of 30 cm>C3×d/(C10+C20)>0.5 cm is satisfied.

9. A transmission apparatus,
the transmission apparatus being for transmitting electric power via a medium that is present between the transmission apparatus and a receiving apparatus, the medium having an electric conductivity higher than $1×10^{-4}$ Siemens per meter and having a relative permittivity higher than 1, the transmission apparatus comprising:

an antenna; and a power transmission circuit that outputs electric power via the antenna of the transmission apparatus, the electric power having a first resonance frequency determined by an impedance of the medium, an impedance of the antenna of the transmission apparatus, and an impedance of an antenna of the receiving apparatus, and the antenna comprises:

a coil;

a first dielectric body that covers a perimeter of the coil; and a second dielectric body that covers a perimeter of the first dielectric body, and a dielectric loss tangent of the second dielectric body is greater than a dielectric loss tangent of the first dielectric body.

10. A power transmission method for a transmission apparatus and a receiving apparatus, the transmission apparatus being for transmitting electric power via a medium that is present between the transmission apparatus and the receiving apparatus, the medium having an electric conductivity higher than $1×10^{-4}$ Siemens per meter and having a relative permittivity higher than 1, the power transmission method comprising:

outputting electric power via an antenna of the transmission apparatus, the electric power having a first resonance frequency determined by an impedance of a medium, an impedance of the antenna of the transmission apparatus, and an impedance of an antenna of the receiving apparatus; and receiving the output electric power via the antenna of the receiving apparatus, wherein the antenna comprises:

a coil;

a first dielectric body that covers a perimeter of the coil; and a second dielectric body that covers a perimeter of the first dielectric body, and wherein a dielectric loss tangent of the second dielectric body is greater than a dielectric loss tangent of the first dielectric body.

* * * * *